(12) United States Patent
Suetsugu et al.

(10) Patent No.: US 6,657,135 B2
(45) Date of Patent: Dec. 2, 2003

(54) CONNECTION STRUCTURE AND ELECTRONIC CIRCUIT BOARD

(75) Inventors: Kenichiro Suetsugu, Nishinomiya (JP); Masuo Koshi, Ikoma (JP); Kenichiro Todoroki, Hirakata (JP); Shunji Hibino, Hirakata (JP); Hiroaki Takano, Hirakata (JP); Mikiya Nakata, Suita (JP); Yukio Maeda, Hirakata (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 383 days.

(21) Appl. No.: 09/959,482

(22) PCT Filed: Mar. 14, 2001

(86) PCT No.: PCT/JP01/01994
§ 371 (c)(1),
(2), (4) Date: Feb. 4, 2002

(87) PCT Pub. No.: WO01/69990
PCT Pub. Date: Sep. 20, 2001

(65) Prior Publication Data
US 2002/0187689 A1 Dec. 12, 2002

(30) Foreign Application Priority Data

Mar. 15, 2000 (JP) .......................... 2000-071635
Mar. 15, 2000 (JP) .......................... 2000-071637

(51) Int. Cl.[7] .................. H01R 12/04; H05K 1/11
(52) U.S. Cl. ............... 174/262; 174/263; 174/265; 174/266; 361/772; 361/773
(58) Field of Search ................. 174/262–268; 361/772–773, 779, 782, 791–792

(56) References Cited

U.S. PATENT DOCUMENTS 4,242,719 A * 12/1980 Conley ................ 361/760
5,637,835 A * 6/1997 Matern ................ 174/266
6,512,185 B2 * 1/2003 Itou .................... 174/260

FOREIGN PATENT DOCUMENTS

| JP | 08163407 | * | 6/1996 |
| JP | 8-181424 | | 7/1996 |
| JP | 11-186712 | | 7/1999 |
| JP | 2000-165047 | | 6/2000 |
| JP | 2000-307223 | | 11/2000 |

OTHER PUBLICATIONS

Katsuaki Suganuma et al., entitled "Mechanism of Lift–Off Phenomenon", in Materia Japan, vol. 38, No. 12, pp. 927–932 (1999) with partial English translation.

* cited by examiner

Primary Examiner—Kamand Cuneo
Assistant Examiner—Tuan Dinh
(74) Attorney, Agent, or Firm—Wenderoth, Lind & Ponack, L.L.P.

(57) ABSTRACT

A connection structure of the present invention has a board with a through hole perforating therethrough, a land formed around the through hole, and a lead extending from an electronic component and disposed in the through hole. The land includes a wall surface land portion formed on a wall surface of the through hole, and front and back surface land portions formed on the front and back surfaces of the board respectively. A fillet connecting the land and the lead includes upper and lower fillet portions respectively contacting with the front and back surface land portions. A profile of the upper fillet portion is smaller than that of the lower fillet portion and is not smaller than that of the through hole. Therefore, occurrence of lift-off is effectively reduced while using a lead-free solder material.

22 Claims, 14 Drawing Sheets

(a)

(b)

(a)

(b)

(a)

(b)

(a)

(b)

(a)

(b)

(a)

(b)

CONNECTION STRUCTURE AND ELECTRONIC CIRCUIT BOARD

TECHNICAL FIELD

The present invention relates to a connection structure in which an electronic component is connected to a board by flow soldering, and an electronic circuit board that includes the connection structure.

BACKGROUND ART

As a conventional process for manufacturing an electronic circuit board by connecting an electronic component(s) onto a board (or a substrate) such as a printed circuit board, there is a process that employs the so-called flow soldering. FIG. 13 shows a schematic partial sectional view of an electronic circuit board manufactured by the conventional flow soldering process. FIG. 14(b) shows an enlarged view of a part shown in FIG. 13, and FIG. 14(a) shows a schematic plan view from top of the part shown in FIG. 14(b) while excluding a fillet.

According to the conventional flow soldering process in a general way, as shown in FIG. 13 and FIG. 14, first a lead 65 (for example, an electrode) extending from an electronic component 67 is inserted to a through hole 62 formed in a board 61 to penetrate therethrough from the front surface (top in the drawing) to the back surface (bottom in the drawing) of the board 61. The board 61 has a land 63 (FIG. 13) made of, for example, a copper foil. The land 63 is formed along a wall surface of the through hole 62 and on front and back surfaces of the board 61 around the through hole 62, and portions of the land 63 on these three surfaces are called a wall surface land portion 63c, a front surface land portion 63a and a back surface land portion 63b, respectively (FIG. 14(b)). The land 63 is connected to a wiring pattern (not shown) formed on the front surface or the back surface of the board 61. The board 61 is covered by a solder resist 64 (indicated with hatching in FIG. 13) on the front surface and back surface thereof except for the land 63.

Then a solder material that has been molten by heating is applied in the form of a wave(s) to the board 61 from the back surface of the board 61. The molten solder material rises up an annular space between the through hole 62 and the lead 65 inserted to the through hole 62 (see, FIG. 14(a)), and spreads over the front surface land portion 63a and the back surface land portion 63b while wetting the surface thereof. The solder material solidifies as its temperature lowers, thereby forming a connection portion 66 as shown in FIG. 13 and FIG. 14(b) (not shown in FIG. 14(a)). The solder material does not deposit on the surface region that is covered by the solder resist 64.

The connection portion 66 made of the solder material, the so-called fillet, is formed as described above (hereinafter, it is simply referred to as the fillet).

Thus the lead 65 of the electronic component 67 and the land 63 formed on the board 61 are electrically and mechanically connected thereby making an electronic circuit board 70.

DISCLOSURE OF INVENTION

In the past, the electronic circuit board manufactured as described above generally employs an Sn—Pb based solder material that contains Sn and Pb as main components, particularly an Sn—Pb eutectic solder material. However, lead included in the Sn—Pb based solder material has a possibility of causing environmental pollution if it is wasted improperly. Accordingly, as an alternative of such lead-containing solder material, a solder material containing no lead, the so-called lead-free solder material has begun to be used on an industrial scale. However, use of the lead-free solder material in the flow soldering process for manufacturing the electronic circuit board leads to such a problem that an upper fillet portion 66a and/or a lower fillet portion 66b peels off (or is lifted off) the front surface land portion 63a and/or the back surface land portion 63b, respectively, as shown in FIG. 14(b), resulting in insecure connection between the land and the fillet. This phenomenon, which is generally called "lift-off", is undesirable for an electronic circuit board that is required to have high bonding strength between the lead of the electronic component and the land in order to provide high reliability of the electronic circuit board. The lift-off hardly occurs in a case of using the Sn—Pb eutectic solder material and there has been no concern over the problem, but recent finding shows that the lift-off frequently occurs in a case of using the lead-free solder material thus raising a concern about it. As the transition from the conventional Sn—Pb based solder material to the lead-free solder material is promoted, it is very important in the manufacture of electronic circuit boards to prevent the lift-off that is a characteristic problem accompanying the use of the lead-free solder material.

The lift-off that occurs when using the lead-free solder material is generally supposedly to be arisen by following two types of cause.

One type of cause relates to the composition of the lead-free soldering material itself used in flow soldering. When using an Sn—Ag—Bi based alloy, for example, as the solder material, an Sn—Bi eutectic solder material among all of metal elements (Sn, Ag, Bi) that constitute the Sn—Ag—Bi based alloy and all of alloys (an Sn—Ag based alloy, an Sn—Bi based alloy and an Ag—Bi based alloy) that can be formed from any combination of these metal elements has a melting point (about 138° C.) that is lower than a melting point (about 200° C.) of the original Sn—Ag—Bi based alloy. A metal and/or an alloy that has a melting point lower than the melting point of the original alloy will be hereafter referred to simply as a low-melting point metal or a low-melting point alloy. In the case of the Sn—Ag—Bi based alloy, the Sn—Bi eutectic alloy is the low-melting point metal.

In this case, as the Sn—Ag—Bi based alloy supplied in a molten state to the board gradually solidifies, the Sn—Bi eutectic alloy that has a melting point lower than that of the original Sn—Ag—Bi based alloy migrates to a region not yet solidified due to the temperature gradient in the fillet, and is concentrated at the region. As a result, the Sn—Bi eutectic alloy is segregated by concentration toward the hottest region of the fillet, namely a portion that solidifies last. The hottest region in an upper portion of the fillet (i.e. an upper fillet portion) is a region near an interface between the land made of copper foil that is a good heat conductor and the fillet (hereafter also referred to simply as a land/fillet interface), and the low-melting point alloy 75 such as the Sn—Bi eutectic alloy is concentrated in the vicinity of the land/fillet interface as shown in FIG. 14(b) to segregate. In the process of solidification of the fillet, in case a tension (indicated schematically by arrow of dashed line for only the upper fillet portion 66a in FIG. 14(b)) due to shrinkage by solidification is exerted in the low-melting point alloy near the land/fillet interface on the board surface where the solder material is still molten and has an insufficient strength, cracks are generated at a periphery of the land/fillet interface, and proceed toward an inside (or a central portion) of the fillet 66a and 66b as the solidification proceeds from the periphery to the inside. Since the cracks are generated in the fillet as described above, a peripheral edge 71 of the fillet is supposed to peel off a peripheral edge of the land 72, as shown in FIG. 14(b), thus causing the lift-off.

Another type of cause relates to combination of a material of the lead 65 and the solder material of the fillet 66. In case the molten solder material that makes contact with the lead 65 is made of an Sn-0.7Cu eutectic alloy (an alloy formed from 0.7% by weight of Cu and the balance of Sn), for example, there is no low-melting point metal or low-melting point alloy having a melting point that is lower than a melting point (about 227° C.) of the original Sn—Cu eutectic alloy among all of the metal elements constituting the solder material and all of the alloys that can be formed from any combination of these metal elements, and therefore the cause described above does not work in this case. However, such cracks as described above are generated also in this case and the lift-off can occur. This may occur depending on combination of the material of the lead, for example the material of a plating member of the lead, and the solder material used in the flow soldering.

The lead 65 generally consists of a base member and a plating member covering the base member (hereafter referred to simply as a plating member). The lead is typically plated with an Sn—Pb based material. In this case, the solder material makes contact with the plating member when the molten solder material of high temperature rises up the through hole 62, so that a component of the plating member can melt into the solder material. Since the Sn—Pb eutectic alloy has a melting point (about 183° C.) that is lower than the melting point of the Sn—Cu eutectic alloy (about 227° C.) used as the solder material, the Sn—Pb eutectic alloy having the lower melting point can segregate in the vicinity of the land/fillet interface when the molten Sn—Cu eutectic alloy solidifies through a process similar to that described above, thus resulting in lift-off.

In addition to the combination of the Sn—Cu based solder material and the Sn—Pb based plating material, A low-melting point alloy such as Sn—Bi (melting point: about 138° C.), Sn—Zn (melting point: about 199° C.) or Sn—In (melting point: about 118° C.) can also be formed, for example in a case a lead-free solder material of Sn—Cu (melting point: about 227° C.), Sn—Ag—Cu (melting point: about 220° C.) or the like that is commonly used in flow soldering is combined with a plating material that includes a metal element of Bi, Zn or In. Lift-off occurs in such a case as described above where there is a metal element, which has a melting point lower than that of the original soldering material, among all of the metal elements that constitute the lead (for example the plating member) as well as the solder material and all of the alloys that can be formed from all possible combinations of two or more of these metal elements.

Both of the two causes arise from the fact that a low-melting point alloy (or low-melting point metal) having a composition different from the composition of the alloy constituting a bulk of the fillet (the latter composition is substantially same as the composition of the original solder material) precipitates in the vicinity of the land/fillet interface. Furthermore, the two causes may act in combination in actual fact.

It is supposed that any of the two causes described above does not exist in a combination of the conventional Sn—Pb eutectic solder material and the Sn—Pb plating material, thus the problem of lift-off does not arise. Lift-off occurs conspicuously when the lead-free solder material is used, and therefore may be regarded as a distinctive problem of the lead-free solder material.

The present invention has been made in order to solve the problem of the conventional constitution described above. An object of the present invention is to provide a connection structure comprising a board with a electronic component connected thereon by flow soldering wherein the occurrence of lift-off is effectively reduced, and an electronic circuit board that includes the connection structure.

The present inventors have studied for effectively reducing the occurrence of lift-off in the flow soldering process while approaching in view of structure and/or material of the connection structure, and thus the present invention has been completed.

In one aspect of the present invention, there is provided a connection structure comprising a board having a front surface and a back surface with a through hole formed therein; a land including a wall surface land portion formed on a wall surface of the through hole and front and back surface land portions respectively formed on the front and back surfaces of the board around the through hole; a lead extending from an electronic component and disposed so as to penetrate the through hole from the front surface to the back surface of the board; and a fillet made of a solder material by flow soldering so as to connect the land and the lead, the fillet including upper and lower fillet portions respectively located on the front and back surfaces of the board, wherein a profile of the upper fillet portion contacting with the front surface land portion is smaller than a profile of the lower fillet portion contacting with the back surface land portion, and is not smaller than a profile of the through hole.

As used herein, the profile of the upper fillet portion or the lower fillet portion refers to an outline (or a contour) or a sectional area of the fillet in a section that is substantially parallel to the principal plane (or the front surface or the back surface) of the board where the sectional area is maximum, and is generally equal to an outline of an exposed portion of the front surface land portion or the back surface land portion whereon the molten solder material has been supplied by flow soldering and spreads, or to an area wetted by the solder material. The profile of the upper fillet portion or the lower fillet portion is typically represented by an outer diameter thereof or an outer diameter of the exposed portion in case the exposed portion of the front surface land portion or the back surface land portion has an annular shape (and therefore has a circular outline). As used herein, the exposed portion of the front surface land portion or the back surface land portion refers to a portion that is exposed when the solder material is supplied in the flow soldering process and is to make contact with the solder material.

In the connection structure of the present invention as described above, since an outer diameter of the upper fillet portion is smaller than that of the lower fillet portion, an exposed sloping area of the upper fillet portion can be made smaller than in the case where the outer diameter of the upper fillet portion is larger than that of the lower fillet portion, thus making it possible to decrease the tension generated by the solidification and shrinkage of the solder material. This makes it possible to make the possibility of lift-off, that conspicuously occurs when the lead-free solder material is used, effectively lower than in the conventional constitution.

In one embodiment of the present invention, a profile of the front surface land portion is smaller than a profile of the back surface land portion and/or a peripheral edge of the front surface land portion is covered by a solder resist. By forming the land itself so that the outer diameter of the front surface land portion is smaller than the outer diameter of the back surface land portion, the outer diameter of the upper fillet portion can be made smaller than the outer diameter of the lower fillet portion. The outer diameter of the upper fillet portion can also be made smaller than the outer diameter of the lower fillet portion by covering the peripheral edge of the front surface land portion with the solder resist, so that the outer diameter of the exposed portion of the front surface land portion is smaller than the outer diameter of the front surface land portion itself and making the outer diameter of the exposed portion of the front surface land portion smaller than the outer diameter of the back surface land portion. It is noted that the profile of the front surface land portion or the back surface land portion refers to an outline of the land as formed on the front surface or the back surface of the board or an area of the land on a plane which is parallel to the front surface or the back surface.

In a preferred embodiment, the wall surface land portion has a tapered portion at an end thereof connecting to the front surface of the board. By providing such tapered portion, a region of the highest temperature of the solder material is formed in a vicinity of the tapered portion in the process of solidification, so that the low-melting point metal can be concentrated in such region while preventing from precipitating near the peripheral edge of the filet. Furthermore, such a tapered portion makes it possible to improve the bonding strength between the fillet and the land so that the connection between the fillet and the land can withstand the tension caused by the solidification and shrinkage of the solder material. This further reduces the probability of the occurrence of lift-off.

In a preferred embodiment, another through hole is provided to penetrate the board at a position near the through hole described above, while the land is formed so as to cover a wall surface of the another through hole and areas intervening between these two through holes on the front surface and the back surface of the board respectively. The areas intervening between the through holes on the front surface of the board is covered with the solder resist. In such a constitution, a temperature of the solder material becomes highest on the intervening land portions between the through holes during the solidification process, so that the low-melting point metal has a positive tendency to segregate in the vicinity of the intervening land portions between the two through holes, thus an amount of low-melting point metal precipitating in the vicinity of the other land/fillet interface can be made relatively smaller. This makes it possible to localize the occurrence of cracks upon the intervening land portions between through holes so that, even when lift-off occurs locally, it is confined in a very limited region, namely in the vicinity of the intervening land portions between the through holes and is made less likely to occur in other region, thereby preventing lift-off from occurring completely.

In another aspect of the present invention, there is provided a connection structure wherein temperature rise in the front surface land portion is suppressed instead of making the profile of the upper fillet portion that contacts the front surface land portion smaller than the profile of the lower fillet portion that contacts the back surface land portion and not smaller than the profile of the through hole, or in addition thereto. Specifically, there is such an aspect as described below.

In one embodiment of the present invention, the profile of the upper fillet portion that makes contact with the front surface land portion is smaller than outer diameter of the front surface land portion. This makes it possible to dissipate an amount of heat of the solder material through a region of the front surface land portion that does not make contact with the upper fillet portion, so that the temperature of the front surface land portion is decreased thereby suppressing the temperature rise and the amount of low-melting point metal precipitating in this region can be decreased. As a result, it is made possible to make the probability of the occurrence of lift-off, that conspicuously occurs when the lead-free solder material is used, effectively lower than in the conventional constitution. For example, the profile of the upper fillet portion can be made smaller than the profile of the front surface land portion by applying flow soldering to the board whereon the peripheral edge of the front surface land portion has been covered with the solder resist in advance.

In another embodiment of the present invention, the board includes a heat sink formed in contact with the front surface land portion. In this case, since an amount of heat transmitted from the solder material to the front surface land portion can be dissipated to the heat sink, the temperature rise in the front surface land portion can be suppressed similarly to the embodiment described above, thus makes it possible to make the probability of the occurrence of lift-off, that conspicuously occurs when the lead-free solder material is used, effectively lower than in the conventional structure. The heat sink may be formed by embedding in the board followed by forming the land so as to make contact the front surface land portion with the heat sink.

In further another embodiment of the present invention, a notch is formed in the wall surface land portion. When the solder material cools down through heat dissipation and solidification proceeds from an exposed portion of the solder material, the filet portion between the upper fillet portion and the lower fillet portion is at the highest temperature as to the entire fillet. In the conventional structure, an amount of heat of this fillet portion made of the solder material is transmitted through the wall surface land portion to the front surface land portion resulting in high temperature in the vicinity of a front surface land portion/fillet interface. When the notch is provided in the wall surface land portion as in this embodiment, in contrast, supply of heat from the fillet portion between the upper fillet portion and the lower fillet portion through the wall surface land portion is shut off, thus making it possible to cool down the front surface land portion faster than in the case of the conventional structure and suppress the temperature rise in the front surface land portion. Thus it is made possible to make the amount of the low-melting point metal precipitating in this region smaller and makes it possible to make the probability of the occurrence of lift-off, that conspicuously occurs when the lead-free solder material is used, effectively lower than in the conventional structure.

In another aspect of the invention, there is provided a connection structure wherein at least one projection is provided on at least one of the front surface land portion and the back surface land portion instead of instead of making the profile of the upper fillet portion that makes contact with the front surface land portion smaller than the profile of the lower fillet portion that makes contact with the back surface land portion and not smaller than the profile of the through hole or in addition thereto. According to this embodiment, since the projection is provided in the front surface land portion and/or the back surface land portion, propagation of a crack from the peripheral edge of a land/fillet interface towards the lead can be stopped by the projection, thereby improving the connection strength between the land and the fillet. As a result, the connection between the fillet and the land can withstand the tension caused by the solidification and shrinkage of the solder material, thus making it possible to effectively reduce the occurrence of lift-off, that conspicuously occurs when the lead-free solder material is used.

In one embodiment of the invention, the projection is located on a peripheral edge of at least one of the front surface land portion and the back surface land portion. According to this embodiment, since the projection is provided on the peripheral edge of the front surface land portion and/or the back surface land portion, crack can be caused to propagate in downward direction along a projection/fillet interface instead of the direction from the peripheral edge of the land toward the lead in the land/fillet interface, thus making it possible to improve the connection strength between the land and the fillet. As a result, the connection between the fillet and the land can withstand the tension caused by the solidification and shrinkage of the solder material, thus making it possible to effectively reduce the possibility of the occurrence of lift-off, that conspicuously occurs when the lead-free solder material is used.

In another aspect of the invention, there is provided a connection structure wherein a portion of the lead that is not inserted into the through hole and is located above the front surface of the board is covered by the solder resist so as to restrict a height of the fillet from the front surface of the board by the solder resist, instead of making the profile of the upper fillet portion that makes contact with the front surface land portion smaller than the profile of the lower fillet portion that makes contact with the back surface land portion and not smaller than the profile of the through hole or in addition thereto. According to this embodiment, since the height of the fillet is restricted by the solder resist, a direction of tension generated by the solidification and shrinkage of the solder material at the peripheral edge of an interface of the upper fillet portion/the front surface land portion comes to cross the surface of the board with a more acute angle, thereby decreasing a vertical component of the tension so that peeling of the fillet off the land/fillet interface is less likely to occur. This makes it possible to effectively reduce the possibility of the occurrence of lift-off, that conspicuously occurs when the lead-free solder material is used.

In another aspect of the invention, there is provided a connection structure wherein the land is covered by a metal film, instead of making the profile of the upper fillet portion that makes contact with the front surface land portion smaller than the profile of the lower fillet portion that makes contact with the back surface land portion and not smaller than the profile of the through hole, or in addition thereto. According to this aspect, since the land, preferably the land as a whole, is covered by the metal film so as not to make contact with the solder material, a diffusion layer is formed between the metal film and the land wherein the diffusion layer does not dissolve into the molten solder material during flow soldering, thereby preventing the low-melting point metal from segregating in the land/fillet interface. Thus makes it possible to make the possibility of the occurrence of lift-off, that conspicuously occurs when the lead-free solder material is used, effectively lower than in the conventional constitution. The metal film is preferably made of a metal selected from the group consisting of Sn, Sn—Cu and Sn—Ag, for example a leveler made of such a material.

The connection structures having the various structures according to the present invention as described above may be used individually or in combination thereof.

According to further another aspect of the present invention, there is provided a connection structure comprising a board having a front surface and a back surface with a through hole formed to penetrate through the board; a land formed on a wall surface of the through hole and on the front and back surfaces of the board around the through hole; a lead extending from an electronic component and disposed in the through hole; and a fillet formed from a solder material by flow soldering so as to connect the land and the fillet, wherein all of metal elements that constitute the solder material and all of alloys that can be formed from two or more metal elements selected from the group consisting of these metal elements have melting points not lower than that of the solder material.

In the connection structure of the present invention described above, since there is no low-melting point metal or low-melting point alloy which has a melting point lower than that of the original solder material, among all of metal elements that constitute the solder material and the all of alloys that can be formed from two or more of these metal elements in all possible combinations. This removes one of the causes of lift-off occurring due to the composition of the solder material itself used in the flow soldering. Thus, it is made possible to make the possibility of the occurrence of lift-off, that conspicuously occurs when the lead-free solder material is used, effectively lower than in the conventional structure.

In a preferable embodiment, the lead includes a base member and a plating member that covers the base member, while all of metal elements that constitute the solder material and a material of the plating member, and all of alloys that can be formed from two or more metal elements selected from the group consisting of these metal elements have melting points not lower than that of the solder material. In this case, the other cause of lift-off occurring due to the combination of the composition of the material of the plating member of the lead and the composition of the solder material used in the flow soldering can be eliminated, thus making it possible to reduce the occurrence of lift-off further.

In a further preferable embodiment, all of metal elements that constitute the solder material, the material of the base member and a material of the plating member, and all of alloys that can be formed from two or more of the metal elements selected from the group consisting of these metal elements have melting points not lower than that of the solder material. In this case, occurrence of lift-off can be reduced further by taking the composition of the material of the base member of the lead as well as the solder material and the material of the plating member into consideration.

The solder material is preferably a lead-free solder material selected from the group consisting of Sn—Cu, Sn—Ag—Cu, Sn—Ag and Sn—Ag—Bi—Cu. The material of the plating member is preferably a metal selected from the group consisting of Sn, Sn—Cu and Sn—Ag. The material of the base member is preferably a metal selected from the group consisting of Cu, Fe and Fe—Cu. Preferable combinations of the solder material/the material of the base member/the material of the plating member include, for example, Sn—Cu/Sn—Cu/Cu, Sn—Cu/Sn/Cu, Sn—Cu/Sn—Cu/Fe, Sn—Cu/Sn/Fe, Sn—Cu/Sn—Ag/Cu and Sn—Cu/Sn—Ag/Fe.

In another preferable embodiment, the lead includes the base member and the plating member that covers the base member, while at least one of the metal elements that constitute the base member and/or at least one of alloys formed from: a metal element(s) selected from the metal elements that constitute the solder material and the plating member; and the metal element(s) that constitute the base member has melting point lower than that of the solder material, and the lead is further includes means or a structure for preventing the metal elements that constitute the base member from melting into the fillet. In case the base member is made of a Zn based alloy, for example, the means described above may be an underlaying plating member made of Ni disposed between the base member and the plating member. In this case, Zn that constitutes the base member does not melt into the solder material, so that the formation of a low-melting point metal can be avoided. This makes it possible to make the possibility of the occurrence of lift-off, that conspicuously occurs when the lead-free solder material is used, effectively lower than in the conventional constitution.

The feature related to the material of the connection structure of the present invention described above are preferably used in combination with the various connection structures of the present invention that have the structural features described above, thereby making it possible to make the possibility of lift-off, that conspicuously occurs when the lead-free solder material is used, effectively lower than in the conventional constitution.

All connection structures of the present invention described above can be preferably used for an electronic circuit board that includes a connection structure wherein electronic components are connected onto a board.

Also all connection structures of the present invention are preferably used for a flow soldering process of electronic components onto a board using a lead-free solder material. In this specification, the lead-free solder material refer to a solder material that does not substantially include lead, namely a solder material having lead content that is typically 0.1% by weight or less. Lead-free solder materials include solder materials such as Sn—Cu, Sn—Ag—Cu, Sn—Ag, Sn—Ag—Bi, Sn—Ag—Bi—Cu and Sn—Ag—Bi—In.

The present invention includes the following embodiments 1 to 33.

(Embodiment 1) A connection structure comprising a board having a front surface and a back surface with a through hole formed to penetrate through the board; a land including a wall surface land portion formed on a wall surface of the through hole, a front surface land portion formed on the front surface of the board around the through hole and a back surface land portion formed on the back surface of the board around the through hole; a lead extending from an electronic component and disposed so as to penetrate the through hole from the front surface to the back surface of the board; and a fillet made of a solder material by flow soldering so as to connect the land and the lead, the fillet including an upper fillet portion located on the front surface of the board and a lower fillet portion located on the back surface of the board, wherein a profile of the upper fillet portion that makes contact with the front surface land portion is smaller than a profile of the lower fillet portion that makes contact with the back surface land portion, and is not less than an inner diameter of the through hole.

(Embodiment 2) The connection structure according to embodiment 1, wherein a profile of the front surface land portion is smaller than a profile of the back surface land portion.

(Embodiment 3) The connection structure according to embodiment 1, wherein a peripheral edge of the front surface land portion is covered with a solder resist.

(Embodiment 4) The connection structure according to any one of embodiments 1 to 3, wherein the wall surface land portion has a tapered portion at an end of the wall surface connecting to the front surface of the board.

(Embodiment 5) The connection structure according to any one of embodiments 1 to 4, wherein another through hole is provided to penetrate the board at a position near said former through hole, while said land is formed so as to cover a wall surface of said another through hole and connect between the through holes on the front surface and the back surface of the board, while a portion of the land connecting the through holes on the front surface of the board is covered with the solder resist.

(Embodiment 6) A connection structure comprising a board having a front surface and a back surface with a through hole formed to penetrate through the board; a land including a wall surface land portion formed on a wall surface of the through hole, a front surface land portion formed on the front surface of the board around the through hole and a back surface land portion formed on the back surface of the board around the through hole; a lead extending from an electronic component and disposed so as to penetrate the through hole from the front surface to the back surface of the board; and a fillet made of a solder material by flow soldering so as to connect the land and the lead, the fillet including an upper fillet portion located on the front surface of the board and a lower fillet portion located on the back surface of the board, the connection structure being constructed so as to suppress temperature rise in the front surface land portion.

(Embodiment 7) The connection structure according to embodiment 6, wherein a profile of the upper fillet portion that makes contact with the front surface land portion is smaller than a profile of the front surface land portion.

(Embodiment 8) The connection structure according to embodiment 6 or 7, wherein the board includes a heat sink formed in contact with the front surface land portion.

(Embodiment 9) The connection structure according to any one of embodiments 6 to 8, wherein a notch is formed in the wall surface land portion.

(Embodiment 10) A connection structure comprising a board having a front surface and a back surface with a through hole formed to penetrate through the board; a land including a wall surface land portion formed on a wall surface of the through hole, a front surface land portion formed on the front surface of the board around the through hole and a back surface land portion formed on the back surface of the board around the through hole; a lead extending from an electronic component and disposed so as to penetrate the through hole from the front surface to the back surface of the board; and a fillet made of a solder material by flow soldering so as to connect the land and the lead, the fillet including an upper fillet portion located on the front surface of the board and a lower fillet portion located on the back surface of the board, wherein at least one projection is provided on at least one of the front surface land portion and the back surface land portion.

(Embodiment 11) The connection structure according to embodiment 10, wherein said projection is located at a peripheral edge of at least one of the front surface land portion and the back surface land portion.

(Embodiment 12) A connection structure comprising a board having a front surface and a back surface with a through hole formed to penetrate through the board; a land including a wall surface land portion formed on a wall surface of the through hole, a front surface land portion formed on the front surface of the board around the through hole and a back surface land portion formed on the back surface of the board around the through hole; a lead extending from an electronic component and disposed so as to penetrate the through hole from the front surface to the back surface of the board; and a fillet made of a solder material by flow soldering so as to connect the land and the lead, the fillet including an upper fillet portion located on the front surface of the board and a lower fillet portion located on the back surface of the board, wherein a portion of the lead that is not disposed inside the through hole and is located above the front surface of the board is covered with a solder resist so as to restrict a height of the fillet with respect to the board surface by the solder resist.

(Embodiment 13) A connection structure comprising a board having a front surface and a back surface with a through hole formed to penetrate through the board; a land including a wall surface land portion formed on a wall surface of the through hole, a front surface land portion formed on the front surface of the board around the through hole and a back surface land portion formed on the back surface of the board around the through hole; a lead extending from an electronic component and disposed so as to penetrate the through hole from the front surface to the back surface of the board; and a fillet made of a solder material by flow soldering so as to connect the land and the lead, the fillet including an upper fillet portion located on the front surface of the board and a lower fillet portion located on the back surface of the board, wherein the land is covered with a film (for example, a metal film).

(Embodiment 14) The connection structure according to embodiment 13, wherein the film is made of a metal selected from the group consisting of Sn, Sn—Cu and Sn—Ag.

(Embodiment 15) An electronic circuit board comprising the connection structure of any one of embodiments 1 to 14.

(Embodiment 16) The connection structure according to any one of embodiments 1 to 14, wherein all of metal elements that constitute the solder material and all of alloys made of two or more of said metal elements have melting points not lower than a melting point of said solder material.

(Embodiment 17) The connection structure according to embodiment 16, wherein the solder material is selected from the group consisting of Sn—Cu, Sn—Ag—Cu, Sn—Ag and Sn—Ag—Bi—Cu.

(Embodiment 18) The connection structure according to embodiment 16 or 17, wherein the lead includes a base member and a plating member that covers said base member, and all of metal elements that constitute the solder material and the plating member and all of alloys made of two or more of said metal elements in all possible combinations have melting points not lower than the melting point of said solder material.

(Embodiment 19) The connection structure according to embodiment 18, wherein the plating member is made of a metal selected from the group consisting of Sn, Sn—Cu and Sn—Ag.

(Embodiment 20) The connection structure according to embodiment 18 or 19, wherein all of metal elements that constitute the solder material, the base member and the plating member, and all of alloys made of two or more of said metal elements in all possible combinations have melting points not lower than the melting point of said solder material.

(Embodiment 21) The connection structure according to any one of embodiments 18 to 20, wherein the base member is made of a material selected from the group consisting of Cu, Fe and an Fe—Cu alloy.

(Embodiment 22) The connection structure according to embodiment 16 or 17, wherein the lead includes a base member and a plating member that covers said base member, and all of metal elements that constitute the solder material, the base member and the plating member and all of alloys made of two or more of said metal elements in all possible combinations have melting points not lower than the melting point of said solder material, and the lead is provided with means for preventing the metal elements that constitute the base member from melting into the fillet.

(Embodiment 23) The connection structure according to embodiment 22, wherein the base member is made of a Zn based alloy and said means is an underlaying plating member made of Ni disposed between the base member and the plating member.

(Embodiment 24) An electronic circuit board comprising the connection structure of any one of embodiments 16 to 23.

(Embodiment 25) A connection structure comprising a board having a front surface and a back surface with a through hole formed to penetrate through the board; a land formed on a wall surface of the through hole, the front surface and the back surface of the board around the through hole; a lead extending from an electronic component and disposed in the through hole; and a fillet made of a solder material by flow soldering so as to connect the land and the lead, wherein all of metal elements that constitute the solder material and all of alloys made of two or more of said metal elements in all possible combinations have melting points not lower than a melting point of said solder material.

(Embodiment 26) The connection structure according to embodiment 25, wherein the solder material is selected from the group consisting of Sn—Cu, Sn—Ag—Cu, Sn—Ag and Sn—Ag—Bi—Cu.

(Embodiment 27) The connection structure according to embodiment 25 or 26, wherein the lead includes a base member and a plating member that covers said base member, and all of metal elements that constitute the solder material and the plating member, and all of alloys made of two or more of said metal elements in all possible combinations have melting points not lower than the melting point of said solder material.

(Embodiment 28) The connection structure according to embodiment 27, wherein the plating member is made of a metal selected from the group consisting of Sn, Sn—Cu and Sn—Ag.

(Embodiment 29) The connection structure according to embodiment 27 or 28, wherein all of metal elements that constitute the solder material, the base member and the plating member, and all of alloys made of two or more of said metal elements in all possible combinations have melting points not lower than the melting point of said solder material.

(Embodiment 30) The connection structure according to any one of embodiments 27 to 29, wherein the base member is made of a material selected from the group consisting of Cu, Fe and an Fe—Cu alloy.

(Embodiment 31) The connection structure according to embodiment 25 or 26, wherein the lead includes a base member and a plating member that covers said base member, and all of metal elements that constitute the solder material, the base member and the plating member, and all of alloys made of two or more of said metal elements in all possible combinations have melting points not lower than the melting point of said solder material, while the lead is provided with means for preventing the metal element that constitutes the base member from melting into the fillet.

(Embodiment 32) The connection structure according to embodiment 31, wherein the base member is made of a Zn based alloy and said means is an underlaying plating member made of Ni disposed between the base member and the plating member.

(Embodiment 33) An electronic circuit board comprising the connection structure of any one of embodiments 25 to 32.

BEST MODE FOR CARRYING OUT THE INVENTION

Figure 1:
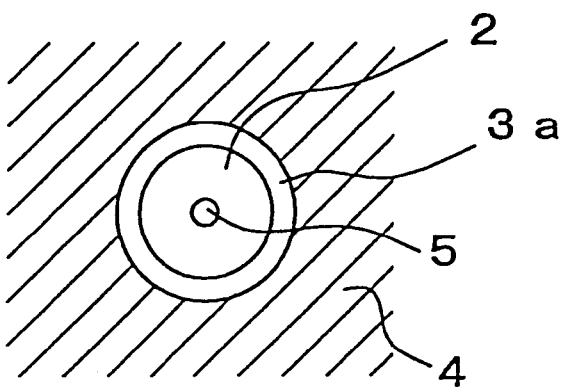
FIG. 1(a) shows a schematic top view of an electronic circuit board (while omitting a fillet) that has a connection structure of other embodiment of the present invention.
FIG. 1(b) shows a schematic sectional view of FIG. 1(a)
Figure 1:
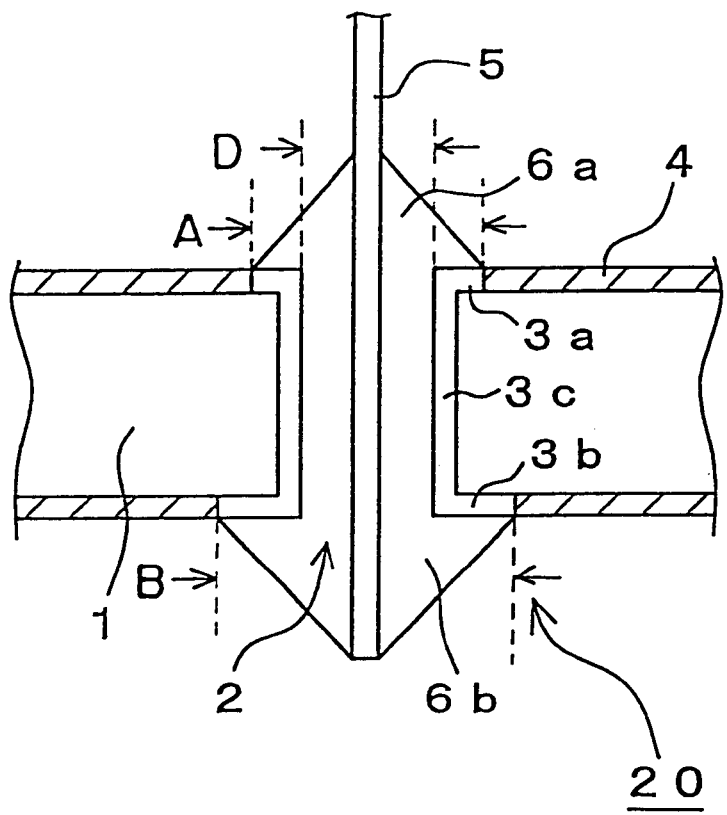

Now preferred embodiments of the present invention will be described below with reference to the accompanying drawings. In FIG. 1 to FIG. 12, similar members are identified with the same reference numerals. Description as to similar constitutions of the embodiments will be omitted, and following description will focus on differences among the embodiments.

Embodiment 1

This embodiment relates to an electronic circuit board that includes the connection structure wherein the profile of the upper fillet portion that makes contact with the front surface land portion is made smaller than the profile of the lower fillet portion that makes contact with the back surface land portion and not smaller than the profile of the through hole. FIG. 1(b) shows a schematic sectional view of the electronic circuit board of this embodiment, and FIG. 1(a) shows a schematic top view of FIG. 1(b) while omitting the fillet. FIG. 1(a) shows a top view equivalent to that of a board before the solder material is supplied thereto by flow soldering, while the same applies also to FIG. 2(a), FIG. 3(a) and FIG. 4(a) to be described later.

As shown in FIG. 1(a) and FIG. 1(b), an electronic circuit board 20 of this embodiment has a through hole 2 formed so as to penetrate the board 1. A land is integrally formed including a wall surface land portion 3c that is formed along a wall surface of the through hole 2, a front surface land portion 3a that is formed on a front surface (or a top surface in the drawing) of the board 1 around the through hole 2 and a back surface land portion 3b that is formed on a back surface (or a bottom surface in the drawing) of the board 1 around the through hole 2. The front surface land portion 3a and/or the back surface land portion 3b are connected to a wiring pattern (or a circuit pattern, not shown) formed on the front surface and/or the back surface of the board 1. A lead (electrode) 5 extending from an electronic component (not shown) is passed through the through hole 2 from the front surface to the back surface of the board 1, so as to be connected with the land electrically and mechanically by means of a fillet including an upper fillet portion 6a and a lower fillet portion 6b. More specifically, the fillet is constituted from the upper fillet portion 6a and the lower fillet portion 6b that have substantially conical shape and a cylindrical fillet portion that connects the upper fillet portion 6a and the lower fillet portion 6b while considering removal for the lead 5 that passes the fillet at substantially the center thereof. The fillet is made of a solder material in a flow soldering process.

The through hole 2 has any shape as long as it is appropriate for the lead 5 to pass therethrough and the solder material to rise up an annular space between the lead 5 and the wall surface of the through hole 2. When the lead 5 has a circular cross section of about 0.5 mm in diameter, for example, the through hole 2 has a cylindrical shape of about 0.9 to 1.0 mm in diameter (D).

Planer shapes of the front surface land portion 3a and the back surface land portion 3b on a plane parallel to a principal plane of the board 1 may be any shape such as circle, ellipse or rectangle, except for a portion of the through hole 2. In this embodiment, each of the front surface land portion 3a and the back surface land portion 3b has a circular shape (the front surface land portion 3a and the back surface land portion 3b have circular outlines) except for the portion of the through hole 5. Therefore, the planar shapes are annular shapes when the through hole 5 is taken into account (see, FIG. 1(a)). The land can be made of various metallic materials such as copper foil having a thickness of about 30 μm.

A profile "A" of the upper fillet portion 6a is represented by the outer diameter of the front surface land portion 3a, in case the front surface land portion 3a has a circular outline and is not covered by the solder resist 4 or the like and an entire surface of the front surface land portion 3a is wetted by the solder material as in this embodiment. A profile "B" of the lower fillet portion 6b is also represented by the outer diameter of the back surface land portion 3b, in case the back surface land portion 3b has a circular outline and is not covered by the solder resist 4 or the like and an entire surface of the back surface land portion 3b is wetted by the solder material as in this embodiment, similarly to the case of the upper fillet portion 6a. A profile "D" of the through hole 2 is represented by a diameter thereof in case the through hole 2 has a circular cross section as in this embodiment. According to this embodiment, the outer diameter "A" of the upper fillet portion is smaller than the outer diameter "B" of the lower fillet portion 6b and is not smaller than the diameter "D" of the through hole 2. Thus, the profile of the upper fillet portion 6a that makes contact with the front surface land portion 3a is smaller than the profile of the lower fillet portion 6b that makes contact with the back surface land portion 3b and is not smaller than the profile of the through hole 2.

While lift-off may occur in the land/fillet interface on both the front surface and the back surface of the board in case the lead-free solder material is used, it tends to occur only on the front surface of the board when a solder material such as Sn—Cu, Sn—Ag or Sn—Ag—Cu is used. This is supposedly because more material of the plating member of the lead is dissolved into the solder material as the solder material rises up the through hole. We have found that reducing occurrence of cracks in a upper fillet portion 6a/front surface land portion 3a interface is effective in reducing the occurrence of lift-off. In order to reduce the occurrence of cracks in the upper fillet portion 6a/front surface land portion 3a interface, it is preferable to decrease the outer diameter of the upper fillet portion 6a. In the conventional electronic circuit board, the outer diameter of the upper fillet portion is 1.5 or more times as large as the diameter of the through hole. In order to reduce the occurrence of lift-off in comparison to the conventional constitution, the outer diameter of the upper fillet portion 6a is preferably made 1.5 or less times, more preferably 1.2 or less times as large as the diameter of the through hole. Further, the outer diameter of the upper fillet portion 6a is preferably not smaller than the diameter of the through hole 2 since it is desired to be formed so as to fill in the through hole. Thus the outer diameter "A" of the upper fillet portion 6a is preferably in a range from 1.0 to 1.5 times, more preferably in a range from 1.1 to 1.2 times as large as the diameter "D" of the through hole 2.

The outer diameter "B" of the lower fillet portion 6b may be similar to that in the conventional constitution, since lift-off is less likely to occur on the back surface. However, in order to compensate for decrease in a connection strength between the fillet and the land due to decrease in a contact area between the upper fillet portion 6a and the front surface land portion 3a compared with the conventional constitution and to ensure sufficient connection strength, it is preferable to increase the outer diameter of the lower fillet portion 6b and thereby increase a contact area between the lower fillet portion and the back surface land. The outer diameter "B" of the lower fillet portion 6b is preferably 1.5 or more times, and more preferably from 2 to 3 times as large as the diameter "D" of the through hole 2.

The board 1 may be made of, for example, a glass epoxy resin, a paper phenol or the like having thickness of about 1.6 mm. The electronic components 5 connected onto the board 1 may be a connector or a leaded component such as a resistor, a capacitor, a transistor and an inductor.

According to this embodiment, such a structure is provided as the profile of the upper fillet portion that makes contact with the front surface land portion is smaller than the profile of the lower fillet portion that makes contact with the back surface land portion and is not smaller than the profile of the through hole. This structure makes it possible to set an exposed sloping area of the upper fillet portion to be smaller than in the case where the outer diameter of the upper fillet portion is larger than the certain outer diameter of the lower fillet portion, thereby reducing a tension generated in an interface of the upper fillet portion/the front surface land portion due to the solidification and shrinkage of the solder material. We have found that the occurrence of lift-off can be effectively reduced by preventing the occurrence of cracks at least on the front surface. Therefore, it is made possible to make the possibility of the occurrence of lift-off, that conspicuously occurs when the lead-free solder material is used, effectively lower than in the conventional constitution by reducing the tension generated in the interface of the upper fillet portion/the front surface land portion to reduce the occurrence of cracks as in this embodiment. Moreover, the connection structure of this embodiment has such advantages that it is relatively easy to manufacture, and does not require special equipment.

In addition to the above, the solder material used in the electronic circuit board 20 is preferably selected so that all of metal elements that constitute the solder material of the fillet and all of alloys that can be formed from two or more metal elements selected from the group consisting of the metal elements that constitute the solder material have melting points not lower than a melting point of the solder material. Specifically, Sn—Cu, Sn—Ag—Cu, Sn—Ag or Sn—Ag—Bi—Cu is preferably used as the solder material.

The lead 5 is generally constituted from a base member (not shown) and a plating member (not shown) that covers the base member. In case a material of the plating member melts into the solder material upon forming the fillet, the solder material and the material of the plating member are preferably selected so that all of metal elements that constitute the solder material and the material of the plating member and all of alloys that can be formed from two or more metal elements selected from the group consisting of the metal elements that constitute the solder material and the material of the plating member have melting points not lower than that of the solder material. Furthermore, in case both the material of the plating member and a material of the base member can melts into the solder material, the solder material and the materials of the base member and the plating member are preferably selected so that all of metal elements that constitute the solder material and the materials of the base member and the plating member, and all of alloys that can be formed from two or more metal elements selected from the group consisting of these metal elements that constitute the solder material and the materials of the base member and the plating member have melting points not lower than that of the solder material.

Specifically, for example, Cu, Fe, Fe—Cu or the like can be used for the material of the base member of the lead 5, and Sn, Sn—Cu, Sn—Ag or the like can be used for the material of the plating member material. Preferable combinations of the solder material/the material of the base member/the material of the plating member include Sn—Cu/Sn—Cu/Cu, Sn—Cu/Sn/Cu, Sn—Cu/Sn—Cu/Fe, Sn—Cu/Sn/Fe, Sn—Cu/Sn—Ag/Cu, Sn—Cu/Sn—Ag/Fe and so on.

By selecting preferably the solder material, more preferably the combination of the solder material and the material of the plating member material, and most preferably the combination of the solder material, the material of the plating member and the material of the base member as described above, segregation of the low-melting point metal can be prevented from occurring in the vicinity of the land/fillet interface due to a temperature gradient in the fillet. Thus, it is made possible to effectively reduce the possibility of the occurrence of lift-off, that conspicuously occurs when the lead-free solder material is used.

However, the present invention is not limited to the constitution described above, and the solder material, the material of the base member and the material of the plating member are preferably selected so that one or more may have a melting point not lower than that of the original solder material among all of metal elements that constitute the solder material, the material of the base member and the material of the plating member and all of alloys that can be formed from all possible combinations of two or more of these metal elements.

For example, the base member of the lead 5 may also be made of a Zn based alloy that can melt into the solder material so as to form a low-melting point metal (an Sn—Zn alloy having a melting point of 199° C.). In case the element(s) that constitutes the material of the base member combines with the metal element(s) that constitutes the solder material and/or the material of the plating member so as to form a low-melting point alloy as described above, or the metal element itself that constitutes the material of the base member becomes a low-melting point alloy, it is preferable to provide an underlaying plating member made of Ni between the base member and the plating member. In this case, it is preferable to apply the plating member with such a material as Sn, Sn—Cu or Sn—Ag on the underlaying plating member. With this constitution, Zn included in the base member does not melts into the solder material and the formation of the low-melting point alloy can be avoided, thus making it possible to make the possibility of the occurrence of lift-off, that conspicuously occurs when the lead-free solder material is used, effectively lower than in the conventional constitution.

Embodiment 2

This is another embodiment of the electronic circuit board that includes a connection structure wherein the profile of the upper fillet portion that makes contact with the front surface land portion is made smaller than the profile of the lower fillet portion that makes contact with the back surface land portion and is not smaller than the profile of the through hole. FIG. 2(b) shows a schematic sectional view of the electronic circuit board of this embodiment, and FIG. 2(a) shows a schematic top view of FIG. 2(b) while omitting the fillet.

As shown in FIG. 2(a) and FIG. 2(b), a peripheral edge of the front surface land portion 3a is covered by a solder resist 4 in an electronic circuit board 21 of this embodiment. More specifically, in the front surface land portion 3a located on a region between a circular boundary indicated by dashed line in FIG. 2(a) and a circular boundary equivalent to the profile of the through hole 2, the peripheral edge thereof is covered by the solder resist 4 (indicated with hatching in the drawing), so that an exposed portion of the front surface land portion 3a is limited by the solder resist 4. In case the peripheral edge of the front surface land portion 3a is covered by the solder resist 4 and the exposed portion of the front surface land portion 3a has a circular outline with only the exposed portion being wetted by the solder material as in this embodiment, the profile "A" of the upper fillet portion 6a is represented by the outer diameter of the exposed portion of the front surface land portion. The profile "B" of the lower fillet portion is represented by the outer diameter of the back surface land portion 3b in case the back surface land portion 3b has a circular outline and an entire surface of the back surface land portion 3b is wetted by the solder material, similarly to Embodiment 1. The profile "D" of the through hole 2 is represented by the diameter thereof when the through hole 2 has a circular cross section, similarly to Embodiment 1. According to this embodiment, the outer diameter "A" of the upper fillet portion 6a is smaller than the outer diameter of "B" of the lower fillet portion 3b and is not less than the diameter D of the through hole 2, and therefore the profile of the upper fillet portion 6a that makes contact with the front surface land portion 3a is smaller than the profile of the lower fillet portion 6b that makes contact with the back surface land portion 3b and is not smaller than the profile of the through hole 2.

Also in this embodiment, similarly to Embodiment 1, the outer diameter "A" of the upper fillet portion 6a is preferably 1.0 to 1.5 times, more preferably 1.1 to 1.2 times as large as the diameter "D" of the through hole, and the outer diameter "B" of the lower fillet portion 6b is preferably 1.5 or more times, more preferably 2 to 3 times as large as the diameter "D" of the through hole.

Figure 2:
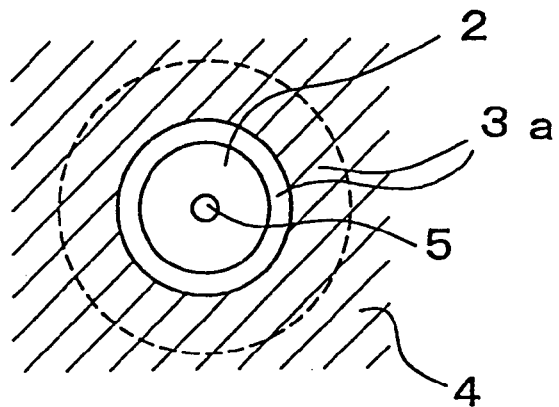
FIG. 2(a) shows a schematic top view of an electronic circuit board (while omitting a fillet) that has a connection structure of another embodiment of the present invention.
FIG. 2(b) shows a schematic sectional view of FIG. 2(a)
Figure 2:
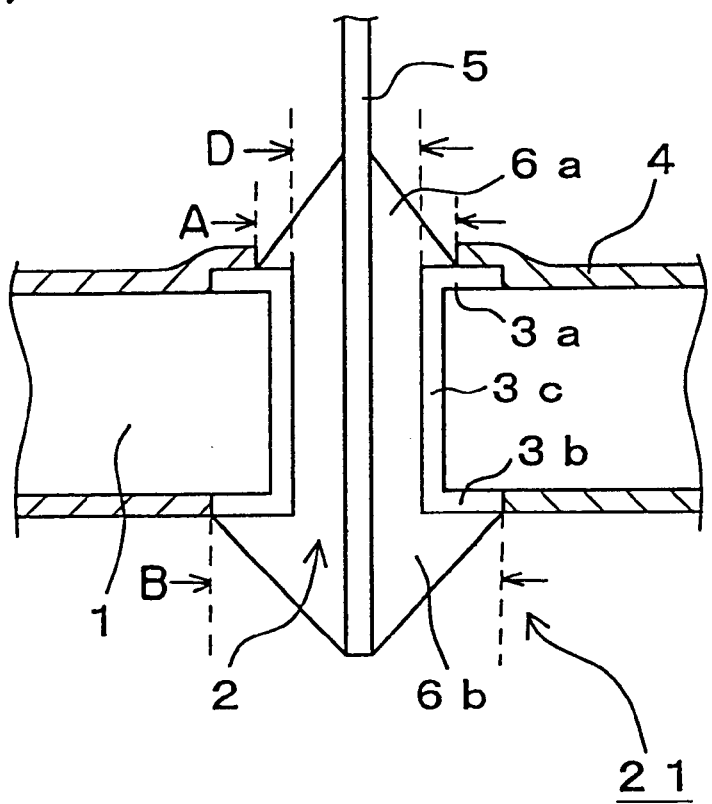
Figure 3:
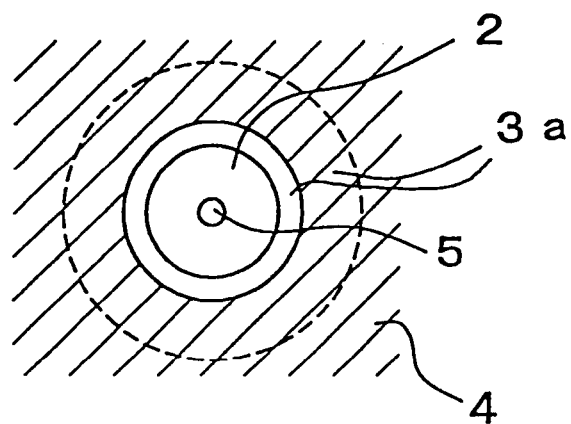
FIG. 3(a) shows a schematic top view of an electronic circuit board (while omitting a fillet) that has a connection structure of another embodiment of the present invention.
FIG. 3(b) shows a schematic sectional view of FIG. 3(a)
Figure 3:
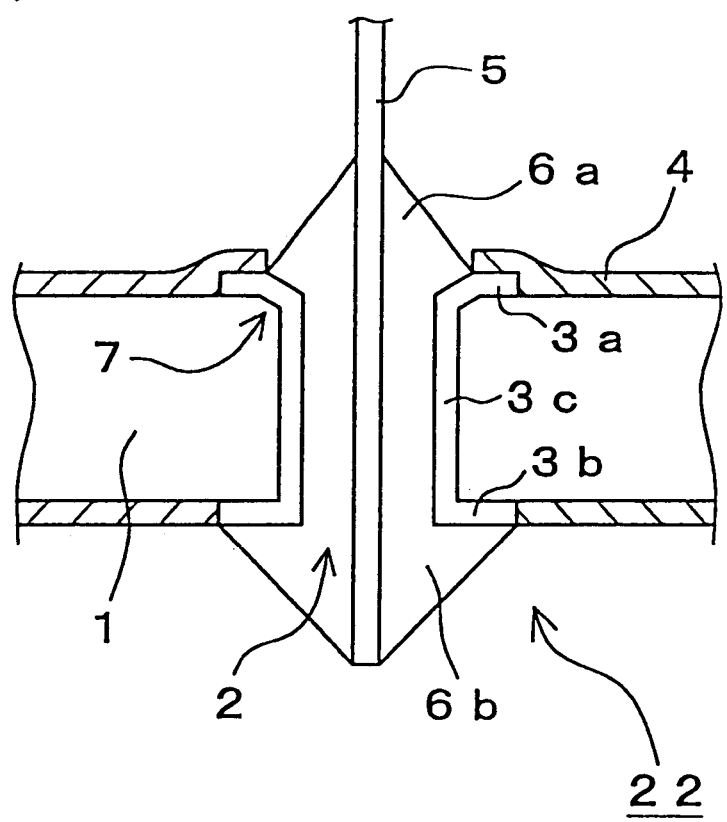
Figure 4:
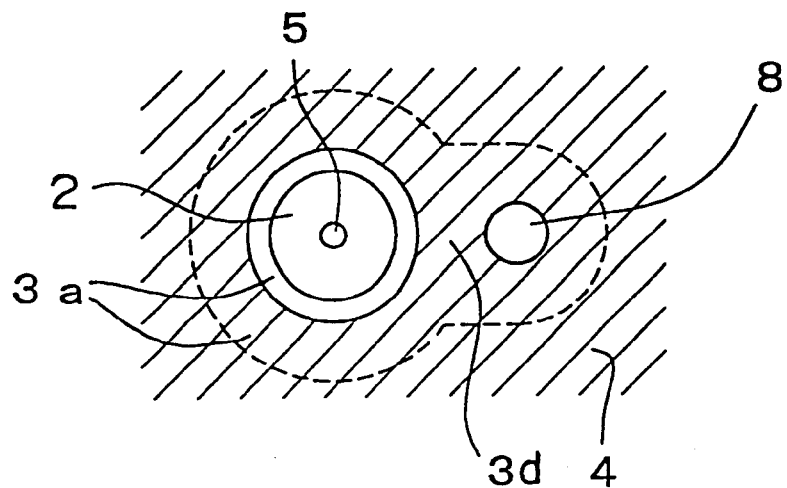
FIG. 4(a) shows a schematic top view of an electronic circuit board (while omitting a fillet) that has a connection structure of another embodiment of the present invention.
FIG. 4(b) shows a schematic sectional view of FIG. 4(a)
Figure 4:
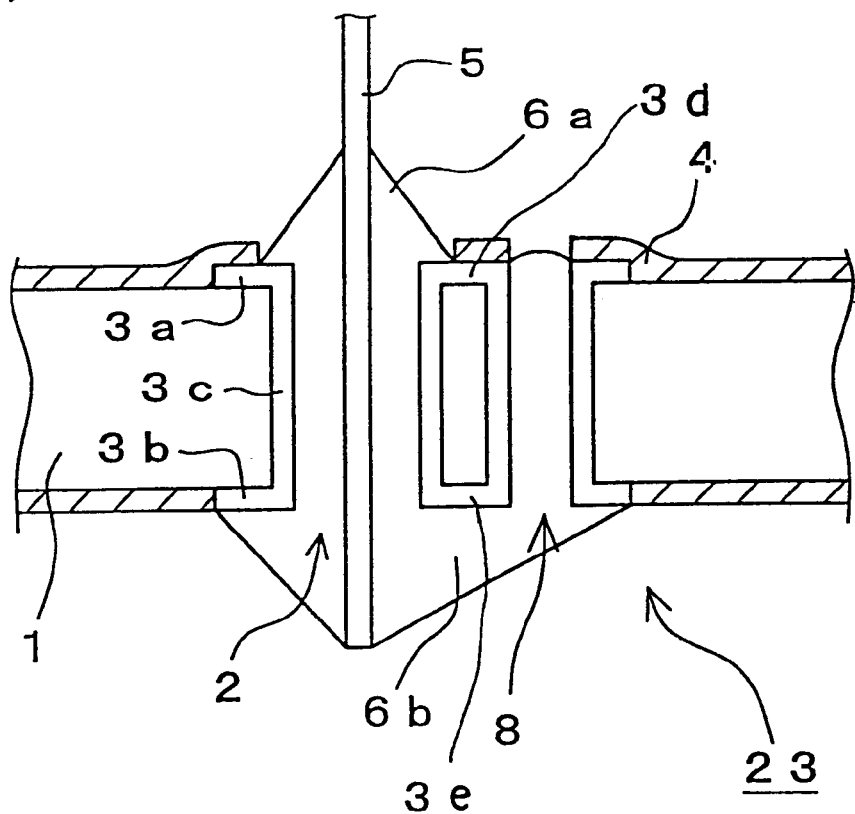

Although the outer diameter of the front surface land portion 3a is shown to be substantially equal to the outer diameter of the back surface land portion 3b in FIG. 2, the present invention is not limited to this configuration and the profile (e.g. the outer diameter) of the front surface land portion 3a may be larger or smaller than the profile (the outer diameter) of the back surface land portion 3b. In case the profile (e.g. the outer diameter) of the front surface land portion 3a is made larger than the profile (the outer diameter) of the back surface land portion 3b, effects of Embodiment 5 to be described later can also be achieved.

A structure where the profile of the upper fillet portion that makes contact with the front surface land portion is smaller than the profile of the lower fillet portion that makes contact with the back surface land portion and is not smaller than the profile of the through hole can be provided similarly to Embodiment 1 also with the connection structure of this embodiment. Thus it is possible to achieve the effect of making the possibility of the occurrence of lift-off, that conspicuously occurs when the lead-free solder material is used, effectively lower than in the conventional constitution. Moreover, the connection structure of this embodiment also has such advantages that it is relatively easy to manufacture, and does not require special equipment, similarly to Embodiment 1.

Embodiment 3

This embodiment is a variation of Embodiment 2. FIG. 3(b) shows a schematic sectional view of the electronic circuit board of this embodiment, and FIG. 3(a) shows a schematic top view of FIG. 3(b) while omitting the fillet.

As shown in FIG. 3(a) and FIG. 3(b), an end of the through hole 2 locating on the front surface of the board 1 is beveled off in an electronic circuit board 22 of this embodiment, so that the wall surface land portion 3c has a tapered portion (or a slanted portion) 7 at the end thereof on the front surface while connecting via this tapered shape to the front surface land portion 3a.

In this embodiment, by providing the tapered portion for the wall surface land portion at its end locating on the front surface, the solder material has a region of the highest temperature in a vicinity of the tapered portion in the process of solidification, so that the low-melting point metal is concentrated in the high-temperature region. Thus, it is possible to prevent the low-melting point metal from precipitating near the peripheral edge of the filet. Such tapered portion also makes it possible to improve the connection strength between the fillet and the land so that the connection of the fillet and the land can withstand the tension caused by the solidification and shrinkage of the solder material. This reduces the occurrence of the lift-off more than that in Embodiment 2.

Although the tapered portion is provided only at the end of the wall surface land portion on the front surface of the board in this embodiment, another end on the back surface or the ends on both of the front and back surface can be provided with such tapered portion. Since we have found that the occurrence of lift-off can be effectively reduced by preventing the occurrence of cracks at least on the front surface, it is preferable to provide the tapered portion at least on the end connecting to the front surface of the board.

The feature of this embodiment can also be used in combination with the connection structure of the electronic circuit board of Embodiment 1.

Embodiment 4

This embodiment is a variation of Embodiment 2. FIG. 4(b) shows a schematic sectional view of the electronic circuit board of this embodiment, and FIG. 4(a) shows a schematic top view of FIG. 4(b) while omitting the fillet.

As shown in FIG. 4(a) and FIG. 4(b), another through hole 8 is provided to penetrate the board 1 near the through hole 2 in an electronic circuit board 23 of this embodiment. The land 3 covers not only the wall surface of the through hole 2 but also a wall surface of the though hole 8 and is integrally formed while covering intervening areas between the through holes 2 and 8 (3d and 3e in the drawing) on the front surface and the back surface of the board 1. The land portion 3d between the through holes 2 and 8 of the land 3 on the front surface of the board 1 is covered by the solder resist 4.

In the connection structure of this embodiment, too, the profile of the upper fillet portion 6a that makes contact with the front surface land portion 3a is smaller than the profile of the lower fillet portion 6b that makes contact with the back surface land portion 3b, and is not smaller than the profile of the through hole 2, as similarly to Embodiment 2. The effect of making it possible to make the possibility of the occurrence of lift-off, that conspicuously occurs when the lead-free solder material is used, effectively lower than in the conventional constitution can be achieved similarly to the case of Embodiment 2.

The connection structure of this embodiment also has the following effects.

Generally, when the fillet is formed from the solder material, an amount of heat which is transmitted from a wave(s) of a molten solder material through the land having a high heat conductivity (for example, a land made of copper) is dissipated from the peripheral edge of the front surface land portion 3a. According to this embodiment, however, since the intervening land portion 3d located between the through holes is supplied with the amount of heat via not only the through hole 2 but also the though hole 8, the land portion 3d intervening between the through holes 2 and 8 reaches a higher temperature than a temperature of the front surface land portion 3a that surrounds the through hole 2 excepting the land portion 3d. As a result, there is a localized portion having a higher temperature (i.e. the land portion 3d located between the through holes 2 and 8) on the surface of the board. This makes it possible to concentrate the segregation of the low-melting point metal in the land portion 3d having the high temperature so as to positively concentrate the occurrence of cracks in the land portion 3d. Therefore, the occurrence of cracks in the other portions can be made relatively lower. Thus even when lift-off occurs, a phenomenon of lifting off of the fillet is restricted in the vicinity of the portion 3d, and the fillet can be prevented from completely lifting off.

The feature of this embodiment can also be used in combination with the connection structure of the electronic circuit board of Embodiments 1 and 3.

Embodiment 5

Figure 5:
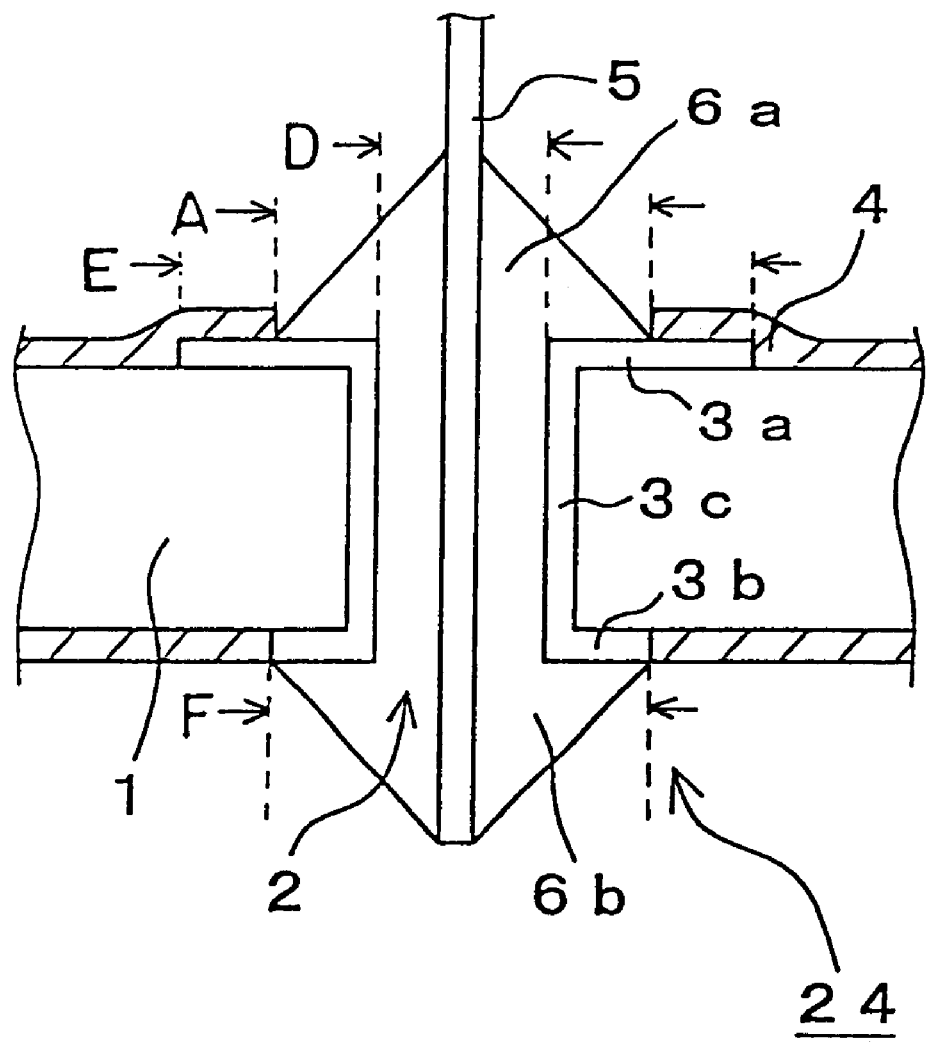
FIG. 5 shows a schematic partial sectional view of an electronic circuit board that has a connection structure of another embodiment of the present invention.

This embodiment relates to an electronic circuit board that has a connection structure constructed so as to suppress temperature rise in the front surface land portion. FIG. 5 shows a schematic sectional view of the electronic circuit board of this embodiment.

As shown in FIG. 5, an peripheral edge of the front surface land portion 3a in an electronic circuit board 24 of this embodiment is covered by the solder resist 4, so that formation of the fillet 6 is restricted by the solder resist 4. As a result, the profile (e.g. outer diameter) "A" of the upper fillet portion 6a that makes contact with the front surface land portion 3a smaller than a profile (e.g. the outer diameter) "E" of the front surface land portion 3a. The profile "E" of the front surface land portion 3a is preferably larger than a profile "F" of the back surface land portion 3b. The outer diameter "A" of the upper fillet portion 6a is preferably 1 to 5 times, more preferably 1 to 1.5 times as large as the diameter "D" of the through hole, and the outer diameter "F" of the back surface land portion 3b (or the lower fillet portion 6b) is preferably 2 to 5 times as large as the diameter "D" of the through hole. The outer diameter "E" of the front surface land portion 3a is preferably 1 to 3 times as large as the outer diameter "F" of the back surface land portion 3b (or the lower fillet portion 6b).

According to this embodiment, the front surface land portion 3a has the peripheral edge that does not contact the fillet 6a, so that the amount of the heat transmitted from the wave(s) of the molten solder material via the land can be dissipated effectively through the peripheral edge of the front surface land portion 3a when forming the fillet made of the solder material. This makes it possible to suppress the temperature rise in the front surface land portion 3a and alleviate the segregation of the low-melting point alloy in the interface of the front surface land portion 3a/the upper fillet portion 6a. Thus, it is possible to effectively reduce the occurrence of lift-off, that conspicuously occurs when the lead-free solder material is used. Moreover, the connection structure of this embodiment also has such advantages that it is relatively easy to manufacture, and does not require special equipment.

Although the peripheral edge for heat dissipation that does not make contact with the fillet is provided only on the front surface land portion in this embodiment, the back surface land portion or both the front and back surface land portions can be provided with such peripheral edge for heat dissipation. However, it is preferable to provide the peripheral edge for heat dissipation at least on the front surface land portion, and more preferably on both the front and back surface land portions.

The feature of this embodiment may also be used in combination with the connection structure of the electronic circuit board of Embodiments 2 to 4.

Embodiment 6

Figure 6:
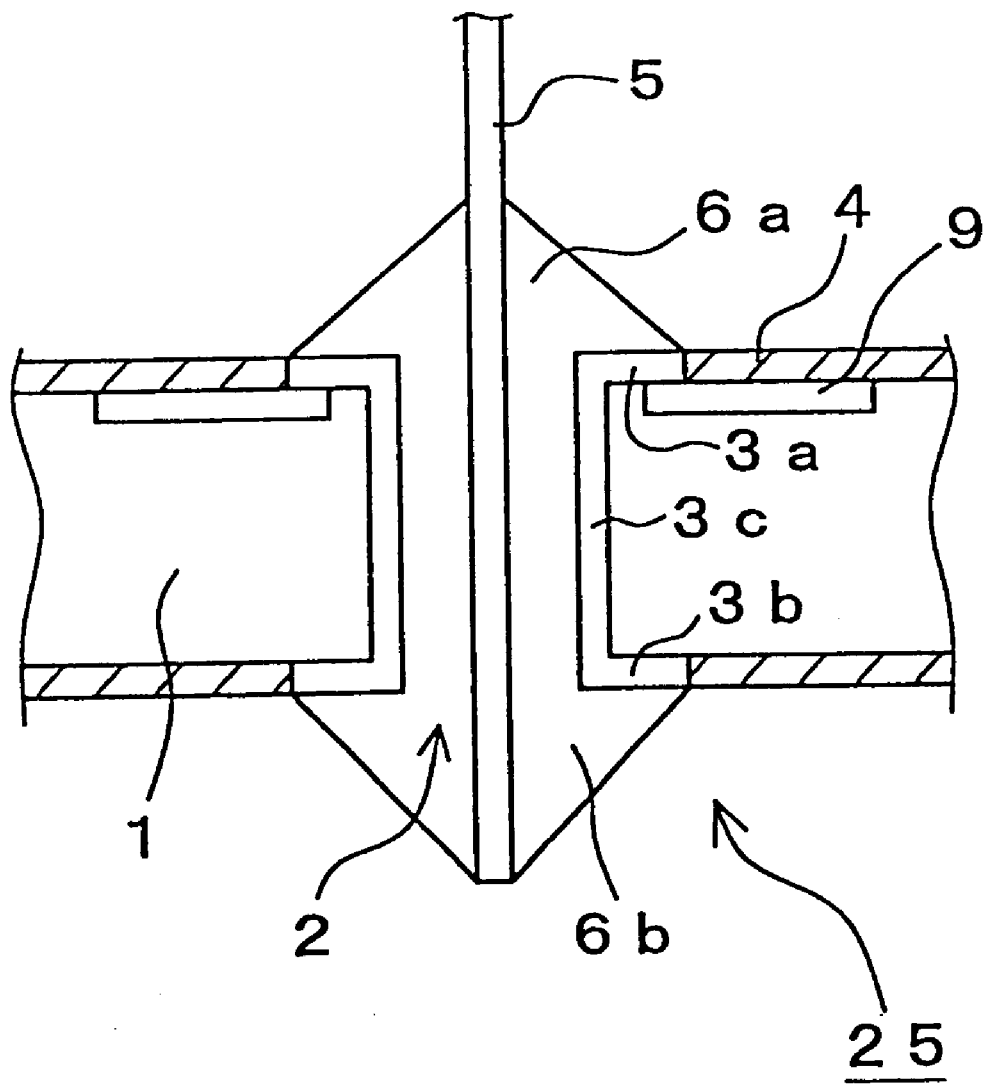
FIG. 6 shows a schematic partial sectional view of an electronic circuit board that has a connection structure of another embodiment of the present invention.

This embodiment is another embodiment relating to an electronic circuit board that has a connection structure constructed so as to suppress the temperature rise in the front surface land portion. FIG. 6 shows a schematic sectional view of the electronic circuit board of this embodiment.

As shown in FIG. 6, a heat sink 9 that contacts the front surface land portion 3a is embedded in the board 1 in an electronic circuit board 25 of this embodiment.

According to this embodiment, similarly to Embodiment 5, an amount of heat transmitted from the wave(s) of the molten solder material via the land can be dissipated effectively to the heat sink 9. This makes it possible to suppress the temperature rise in the front surface land portion 3a and alleviate the segregation of the low-melting point alloy in the interface of the front surface land portion 3a/the upper fillet portion 6a, similarly to Embodiment 5. Thus, it is possible to effectively reduce the occurrence of lift-off, that conspicuously occurs when the lead-free solder material is used.

Although the heat sink is provided only on the front surface of the board in contact with the front surface land portion in this embodiment, it may also be provided on the back surface of the board in contact with the back surface land portion or on both the front and back surface land portions. However, it is preferable to provide the heat sink at least on the front surface land portion, and more preferably on both the front and back surface land portions.

The feature of this embodiment can also be used in combination with the connection structure of the electronic circuit board of Embodiments 1 to 5.

Embodiment 7

Figure 7:
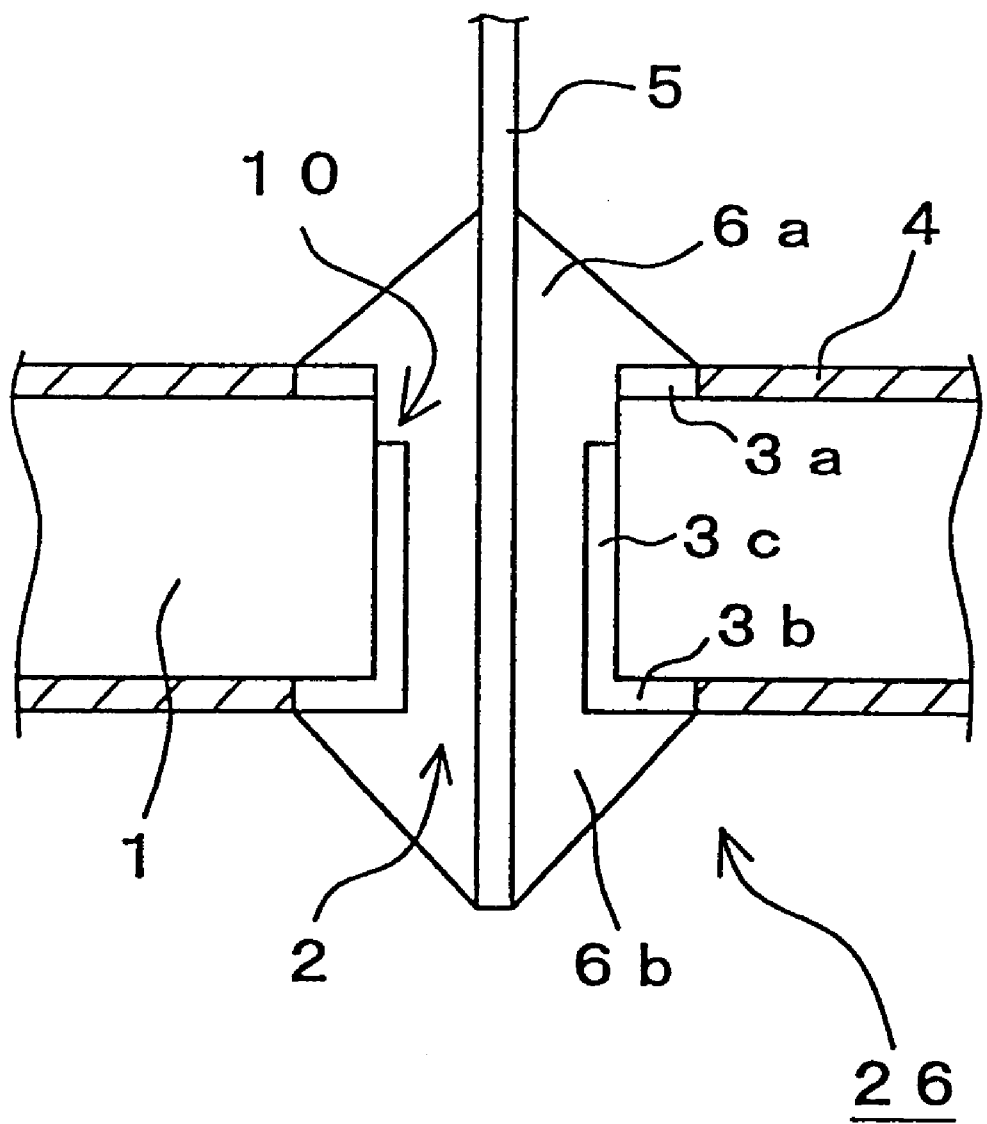
FIG. 7 shows a schematic partial sectional view of an electronic circuit board that has a connection structure of another embodiment of the present invention.

This embodiment is another embodiment relating to an electronic circuit board that has a connection structure constructed so as to suppress the temperature rise in the front surface land portion. FIG. 7 shows a schematic sectional view of the electronic circuit board of this embodiment.

As shown in FIG. 7, the wall surface land portion 3c has a notch 10 formed therein so that a corner of the land is cut off in an electronic circuit board 26 of this embodiment. As a result, the front surface land portion 3a is isolated from the back surface land portion 3b at least partially.

According to this embodiment, as a passage for transmission of heat supplied from the wave(s) of the molten solder via the land is restricted (or shut off when the front surface land portion 3a is completely isolated) by the notch 10, supply of an amount of heat to the front surface land portion 3a can be decreased. This makes it possible to suppress the temperature rise in the front surface land portion 3a and alleviate the segregation of the low-melting point alloy in the interface of the front surface land portion 3a/the upper fillet portion 6a, similarly to Embodiment 5. Thus, it is possible to effectively reduce the occurrence of lift-off, that conspicuously occurs when the lead-free solder material is used.

Although the notch is provided at the end of the wall surface land portion near the front surface of the board in this embodiment, it may also be provided at any position of the wall surface land portion and the notch may also have any shape. Continuity between the front surface land portion and the back surface land portion may be either lost or maintained.

The feature of this embodiment may also be used in combination with the connection structure of the electronic circuit board of Embodiments 1 to 6.

Embodiment 8

Figure 8:
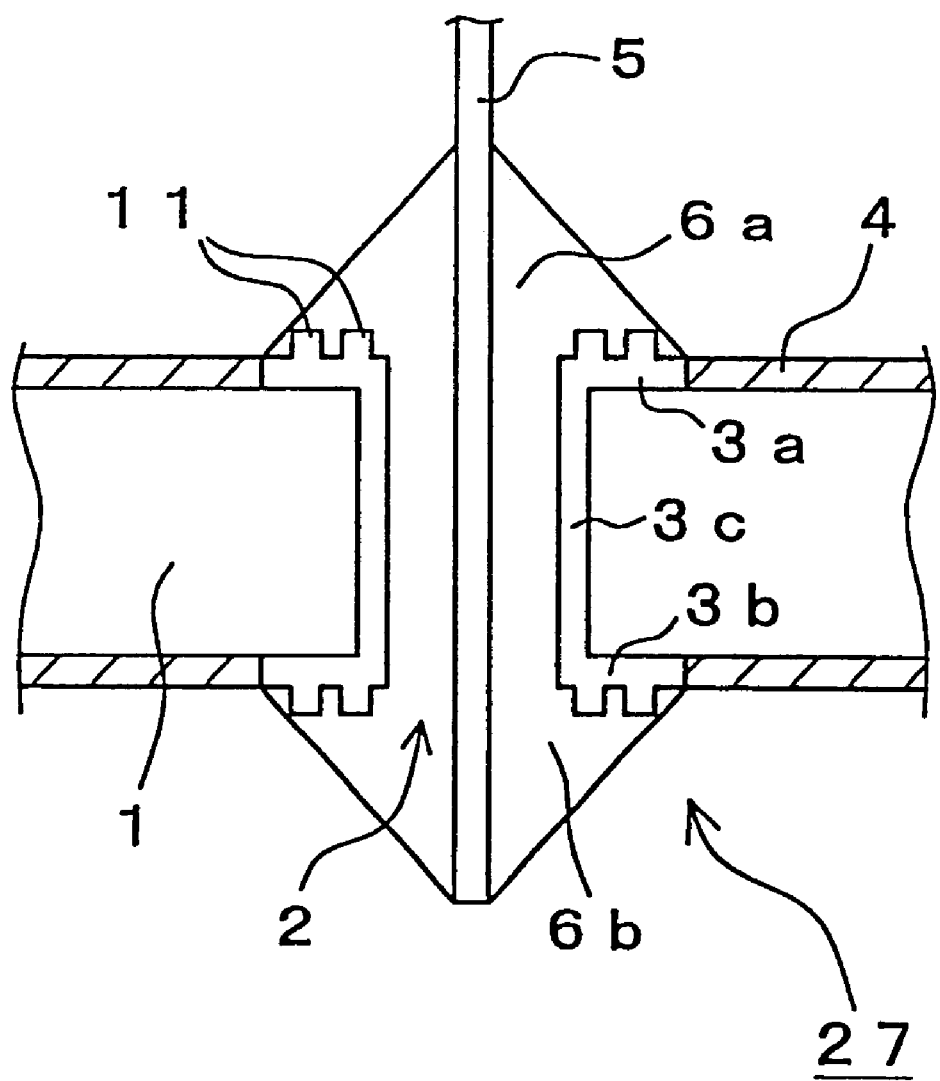
FIG. 8 shows a schematic partial sectional view of an electronic circuit board that has a connection structure of another embodiment of the present invention.
Figure 9:
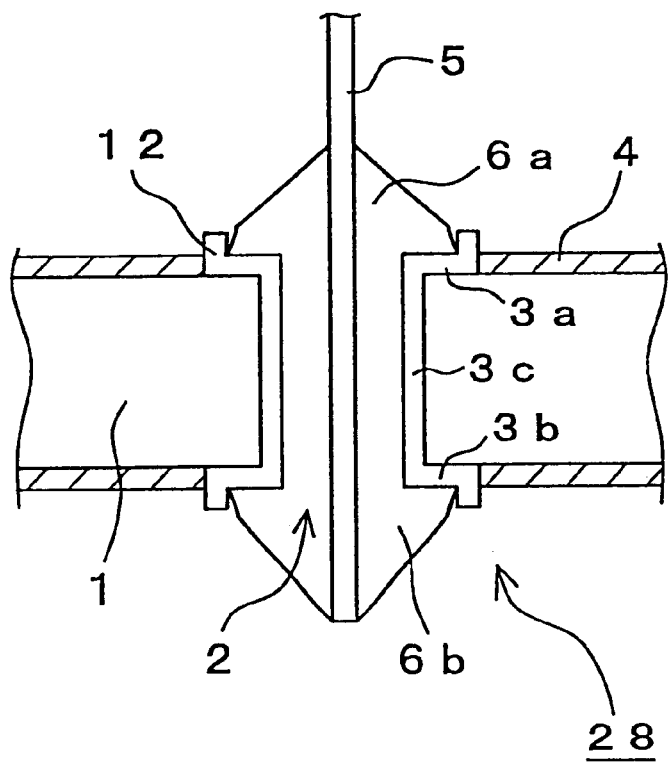
FIG. 9(a) shows a schematic partial sectional view of an electronic circuit board that has a connection structure of another embodiment of the present invention.
FIG. 9(b) shows a partially enlarged view of FIG. 9(a)
Figure 9:
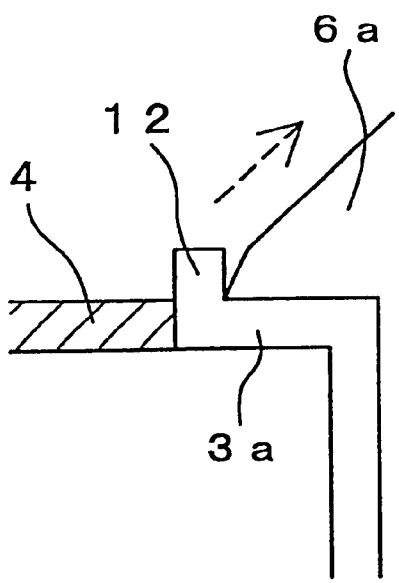

This embodiment relates to an electronic circuit board that has a connection structure wherein at least one projection is provided on the front surface land portion and the back surface land portion, respectively. FIG. 8 is a schematic sectional view of the electronic circuit board of this embodiment.

As shown in FIG. 8, an electronic circuit board 27 of this embodiment has two annular projections 11 each on the front surface land portion 3a and the back surface land portion 3b.

According to this embodiment, progress of cracks in the land/fillet interface can be stopped by the projections 11, thereby improving the connection strength between the upper fillet portion 6a and the front surface land portion 3a and the connection strength between the lower fillet portion 6b and the back surface land portion 3b. This makes it possible to effectively reduce the occurrence of lift-off, that conspicuously occurs when the lead-free solder material is used.

Number and shape of the projections 11 are not limited to those described above, and may be selected freely as long as an uneven surface can be provided on the front surface land portion 3a and the back surface land portion 3b. For example, projections in the form of dots may be provided on the front surface land portion 3a and the back surface land portion 3b.

The projections may not necessarily be provided on both the front surface land portion 3a and the back surface land portion 3b, and instead may be provided only either one of the front and back surface land portions. However, the projections are preferably provided on at least the front surface land portion, and more preferably provided on both the front and back surface land portions.

The feature of this embodiment may also be used in combination with the connection structure of the electronic circuit board of Embodiments 1 to 7.

Embodiment 9

This embodiment is a variation of Embodiment 8. FIG. 9(a) shows a schematic sectional view of the electronic circuit board of this embodiment, and FIG. 9(b) shows a partially enlarged view of FIG. 9(a).

As shown in FIG. 9(a), an electronic circuit board 28 of this embodiment has one annular projection 12 on each peripheral edge of the front surface land portion 3a and the back surface land portion 3b.

According to this embodiment, the projection 12 as described above makes tension (indicated by arrow of dashed line in FIG. 9(b)) generated by the solidification and shrinkage of the fillet act on the interface of the upper filet 6a and the projection 12, so that the cracks generated therein are propagated (or progress) in a direction downward along the interface of the upper filet 6a and the projection 12. As a result, progress of the cracks can be directed along the upper filet 6a/projection 12 interface instead of a lateral direction along the interface of the upper fillet portion 6a/the front surface land portion 3a. Thus, it is possible to improve the connection strength between the land and the fillet. This makes it possible to effectively reduce the occurrence of lift-off, that conspicuously occurs when the lead-free solder material is used also in this embodiment, similarly to Embodiment 8.

The projections may not necessarily be provided on both the front surface land portion 3a and the back surface land portion 3c, and may be provided only either one of the front and back surface land portions. However, the projections are preferably provided on at least the front surface land portion, and more preferably provided on both the front and back surface land portions.

The feature of this embodiment may also be used in combination with the connection structure of the electronic circuit board of Embodiments 1, 6, 7 and 8.

Embodiment 10

Figure 10:
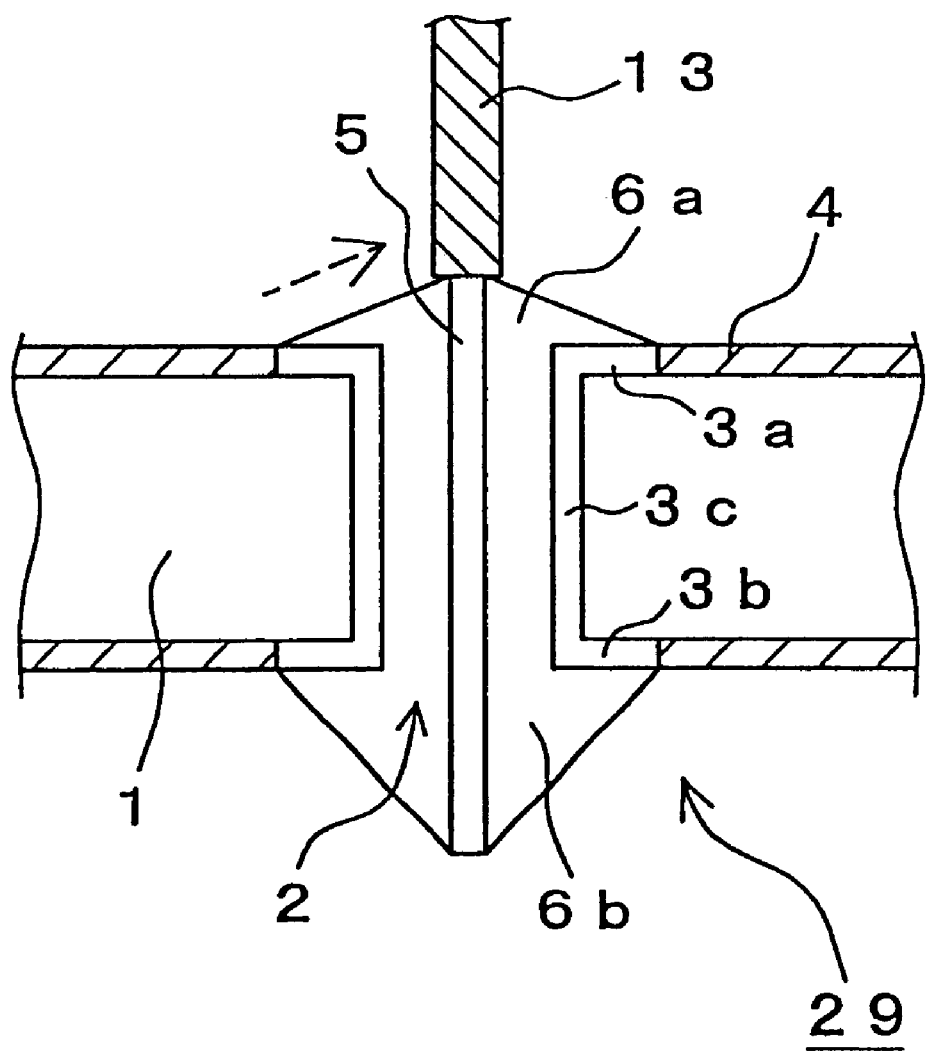
FIG. 10 shows a schematic partial sectional view of an electronic circuit board that has a connection structure of another embodiment of the present invention.

This embodiment relates to an electronic circuit board that has a connection structure wherein the lead is partially covered by a solder resist. FIG. 10 is a schematic sectional view of the electronic circuit board of this embodiment.

As shown in FIG. 10, a portion of the lead 5 that is not inserted into the through hole 2 and is located above the front surface of the board 1 is covered by a solder resist 13 in an electronic circuit board 29 of this embodiment, so that a height of the upper fillet portion 6a with respect to the front surface of the board 1 is restricted by the solder resist 13.

According to this embodiment, since the height of the fillet 6 is restricted by the solder resist 13, the direction of the tension (indicated by arrow of dashed line in FIG. 10(b)), which is generated by the solidification and shrinkage of the solder material and acting on the edge of the interface of the upper fillet portion 6a/the front surface land portion 3a, comes to cross the surface of the board 1 with a more acute angle. As a result, the vertical component of the tension is decreased, so that peeling in the land/fillet interface can be made less likely to occur. This makes it possible to effectively reduce the occurrence of lift-off, that conspicuously occurs when the lead-free solder material is used.

The feature of this embodiment may also be used in combination with the connection structure of the electronic circuit board of Embodiments 1 to 9.

Embodiment 11

Figure 11:
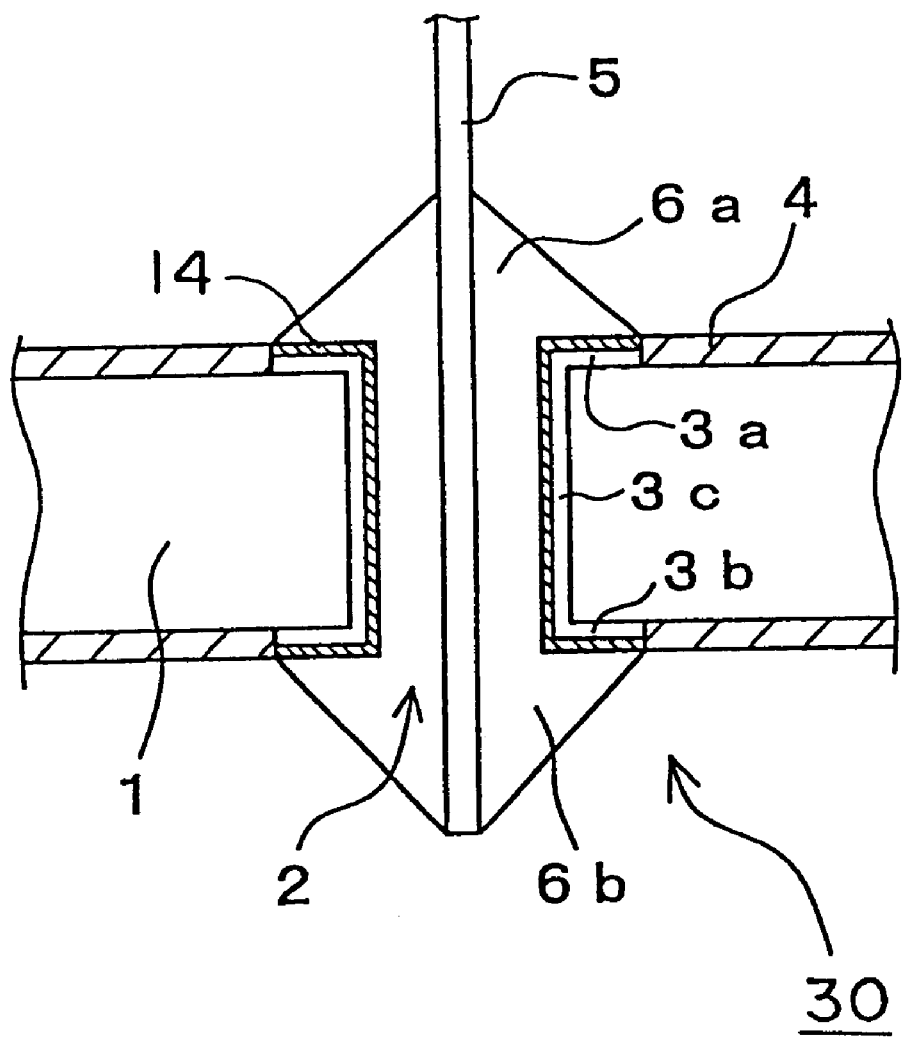
FIG. 11 shows a schematic partial sectional view of an electronic circuit board that has a connection structure of another embodiment of the present invention.

This embodiment relates to an electronic circuit board that has a connection structure wherein the land is covered by a metal film so that the land and the solder material do not contact directly with each other. FIG. 11 shows a schematic sectional view of the electronic circuit board of this embodiment.

As shown in FIG. 11, a metal film 14 is formed while covering the land, in other words, it is formed on the front surface land portion 3a, the wall surface land portion 3c and the back surface land portion 3b in an electronic circuit board 30 of this embodiment. The metal film 14 may be a metal film such as the so-called leveler, and is preferably made of a metal selected from the group consisting of Sn, Sn—Cu and Sn—Ag. The metal film 14 may have a thickness in a range from about 10 to 100 µm.

According to this embodiment, a diffusion layer is formed between the metal film and the land by covering the land with the metal film 14, thereby preventing any of the front surface land portion 3a, the back surface land portion 3b and the wall surface land portion 3c from making direct contact with the solder material. Because of the presence of such diffusion layer, elements included in the land do not melt into the molten solder material during the flow soldering process, so that the low-melting point metal can be prevented from segregating in the interface between the upper fillet portion 6a/the front surface land portion 3a. This makes it possible to effectively reduce the occurrence of lift-off, that conspicuously occurs when the lead-free solder material is used.

The leveler (or the metal film) described above can be formed by a method known in the art.

Although an entire surface of the land comprising the front surface, wall surface and back surface land portions is covered in this embodiment, occurrence of lift-off can be reduced somewhat by covering only the front surface land portion with the metal film. In this case, the metal film (or the leveler) may also be formed, for example, at the same time on the front surface land portion upon printing a solder material such as a cream solder on the front surface of the board.

The feature of this embodiment may also be used in combination with the connection structure of the electronic circuit board of Embodiments 1 to 10.

Embodiment 12

This embodiment has a structure (or constitution) substantially similar to that of the conventional electronic circuit board, but is different therefrom in that a combination of the material of the base member of the lead, the material of the plating member and the solder material is appropriately selected.

Figure 12:
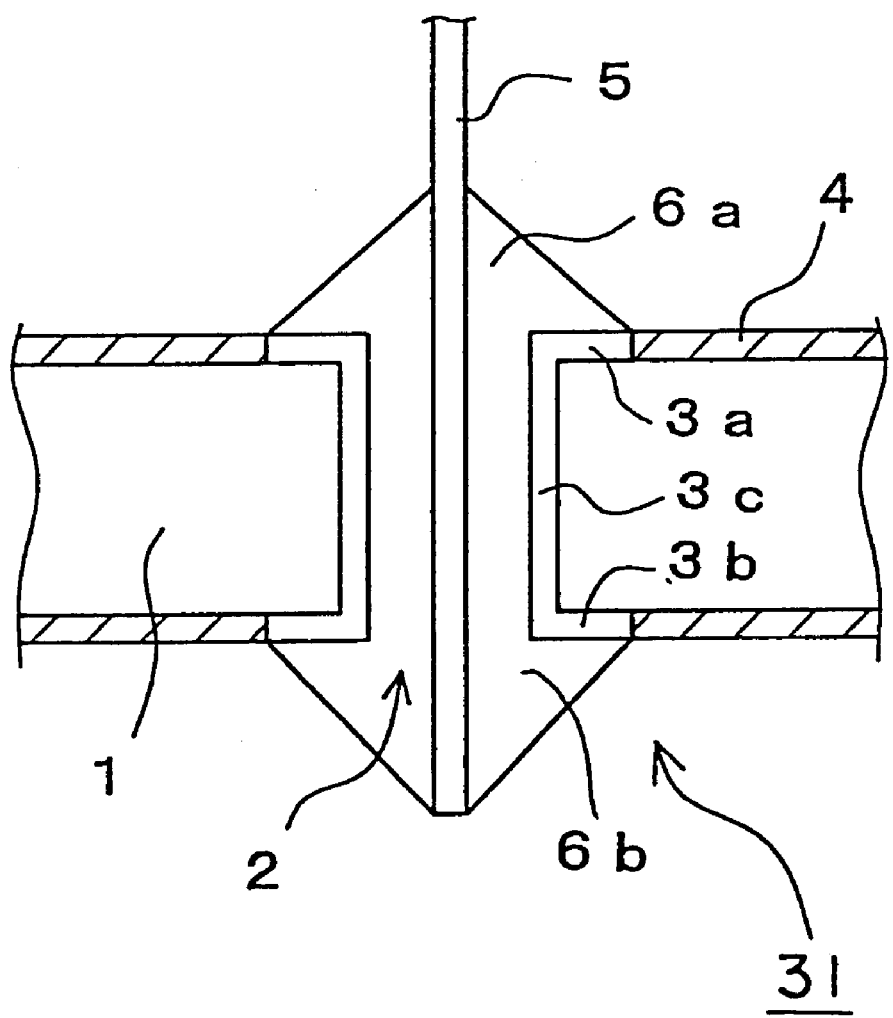
FIG. 12 shows a schematic partial sectional view of an electronic circuit board that has a connection structure of another embodiment of the present invention.
Figure 13:
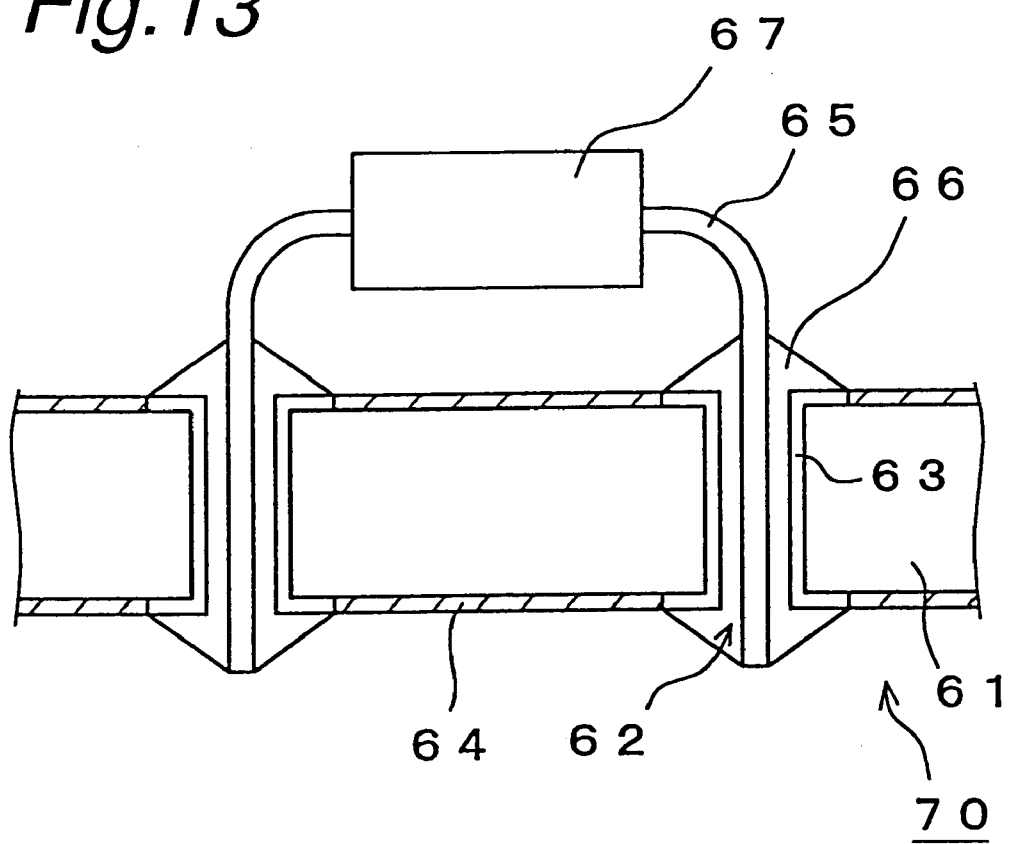
FIG. 13 shows a schematic partial sectional view of a conventional electronic circuit board with one electronic component connected thereon.
Figure 14:
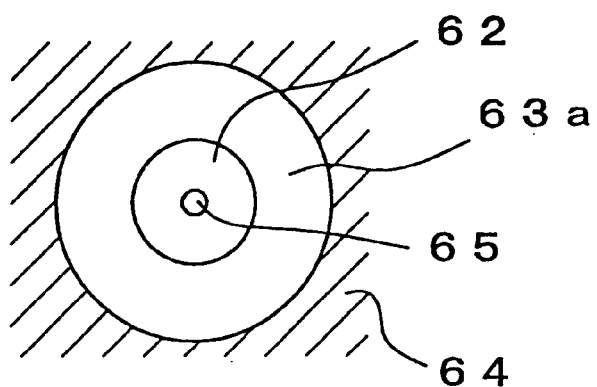
FIG. 14(a) shows an enlarged top view of an area near fillet (while omitting a fillet) of FIG. 13.
FIG. 14(b) shows a schematic sectional view of FIG. 14(a).
Figure 14:
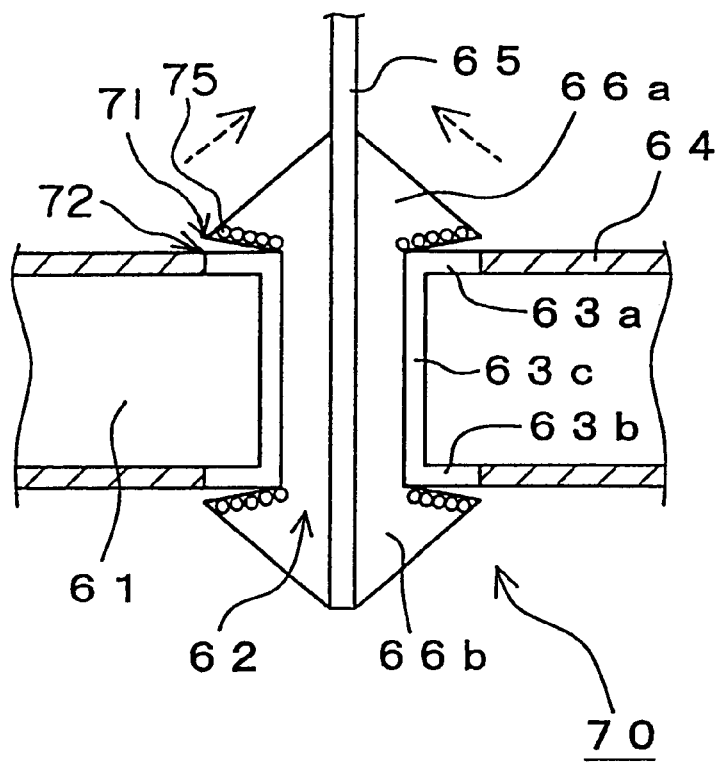

As shown in FIG. 12, an electronic circuit board 31 of this embodiment has the through hole 2 provided to penetrate the board 1. The land is integrally formed consisting of the wall surface land portion 3c formed along the wall surface of the through hole 2, the front surface land portion 3a formed on the front surface of the board 1 (i.e. top surface in the drawing) around the through hole 2 and the back surface land portion 3b formed on the back surface of the board 1 (i.e. bottom surface in the drawing) around the through hole 2. Such land is made of copper, for example. The land is connected to a wiring pattern (not shown) formed on the front surface and/or the back surface of the board 1. On the other hand, the, lead (or electrode) 5 extending from an electronic component (not shown) is passed through the through hole 2. The lead 5 is connect with the land 3 of the board 1 electrically and mechanically by means of the fillet including the upper fillet portion 6a and the lower fillet portion 6b and being made of the solder material. Although the front surface land portion 3a and the back surface land portion 3b are shown in FIG. 12 as having substantially the same profile, the present invention is not limited to this constitution. Generally, the front surface land portion 3a and the back surface land portion 3b have an annular shape of an outer diameter from 2 to 3 mm in plan view. The land may have a thickness of, for example, about 30 µm.

The board 1 may be made of, for example, a glass epoxy resin, a paper phenol or the like and has a thickness of about 1.6 mm. The through hole 2 may have any shape that is appropriate for the lead 5 to pass therethrough and for the solder material to rise up along the annular space between the lead 5 and the wall surface of the through hole 2. In case the lead 5 has a circular cross section of about 0.5 mm in diameter, for example, the through hole 2 has a cylindrical shape of diameter about 0.9 to 1.0 mm. The electronic components 5 connected onto the board 1 may be a connector or components having leads such as a resistor, a capacitor, a transistor and inductor.

In the electronic circuit board 31 as described above, the solder material is selected so that all of metal elements that constitute the solder material of the fillet 6 and all of alloys that can be formed from two or more metal elements selected from the group consisting of the metal elements that constitute the solder material have melting points not lower than that of the solder material.

Specifically, Sn—Cu, Sn—Ag—Cu, Sn—Ag, Sn—Ag—Bi—Cu or the like may be used as the solder material.

Additionally, the lead 5 is generally constituted from the base member (not shown) and the plating member (not shown) that covers the base member. In case the material of the plating member is expected to melt into the solder material at least partially upon forming the fillet, the solder material and the material of the plating member are preferably selected so that all of metal elements that constitute the solder material and the material of the plating member as well as all of alloys that can be formed from two or more metal elements selected from the group consisting of the metal elements that constitute the solder material and the material of the plating member have melting points not lower than that of the solder material. Furthermore, in case both the material of the plating member and the material the base member are expected to melt into the solder material at least partially, the solder material and the materials of the base member and the plating member material are preferably selected so that all of metal elements that constitute the solder material and the materials of the base member and the plating member as well as all of alloys that can be formed from two or more metal elements selected from the group consisting of the metal elements that constitute the solder material and the materials of the base member and the plating member have melting points not lower than that of the solder material.

Specifically, for example, Cu, Fe, an Fe—Cu alloy or the like may be used as the material of the base member of the lead 5, and Sn, Sn—Cu, an Sn—Ag alloy or the like may be used as the material of the plating member.

Preferable combinations of the solder material/the material of the base member/the material of the plating member include Sn—Cu/Sn—Cu/Cu, Sn—Cu/Sn/Cu, Sn—Cu/Sn—Cu/Fe, Sn—Cu/Sn/Fe, Sn—Cu/Sn—Ag/Cu, Sn—Cu/Sn—Ag/Fe and the like.

According to this embodiment, the solder material, preferably the solder material and the material of the base member, more preferably the solder material and the materials of the base member and the plating member are preferably selected so that all of metal elements that constitute such material(s) and all of alloys that can be formed from two or more metal elements selected from the group consisting of these metal elements have melting points not lower than that of the solder material. Therefore, the low-melting point metal is not formed and therefore it is not segregated in the vicinity of the land/fillet interface due to temperature gradient in the fillet. This makes it possible to make the possibility of the occurrence of lift-off, that conspicuously occurs when the lead-free solder material is used, effectively lower than in the conventional constitution.

Embodiment 13

This embodiment has a constitution substantially similar to that of Embodiment 12, but is different therefrom in that an alloy has a melting point lower than that of the solder material. The alloy is formed from: one or more metal elements selected from the group consisting of the metal elements that constitute the solder material and the material of the plating member; and one or more metal elements that constitute the material of the base member.

Specifically, the base member of the lead is made of a material such as a Zn based alloy in this embodiment. The metal element of Zn included in the Zn based alloy melts into the solder material so as to form, for example, an Sn—Zn alloy (melting point: 199° C.) together with the metal element of Sn that constitutes the solder material and/or the plating member material. As the solder material, a lead-free solder material such as Sn—Cu, Sn—Ag—Cu, Sn—Ag, Sn—Ag—Bi, Sn—Ag—Bi—Cu or the like is used. In this case, the Sn—Zn alloy has a melting point lower than that of the solder material, therefore it is understood as a low-melting point alloy. This embodiment is further different from Embodiment 12 in that an underlaying plating member made of Ni is provided between the base member and the plating member, and the plating member made of a material such as Sn, Sn—Cu or Sn—Ag is applied on the underlaying plating member. Since Ni has a very high melting point, Zn included in the base member can be prevented from melting into the solder material by covering the base member with the underlaying plating member of Ni.

With this constitution, Zn included in the base member does not dissolve into the solder material and the formation of the low-melting point alloy of Sn—Zn that includes Zn can be avoided. Thus it is made possible to make the possibility of the occurrence of lift-off, that conspicuously occurs when the lead-free solder material is used, effectively lower than in the conventional construction.

EXAMPLE 1

Connection structures as described in Embodiment 1 were made while varying the solder material used in flow soldering and the profile of the upper fillet portion, and the occurrence of lift-off in the connection structures was studied.

Boards made of a glass epoxy resin measuring about 1.6 mm in thickness, about 180 mm in length and about 300 mm in width were used. The board was provided with a through hole in cylindrical shape having diameter of about 1.3 mm formed at right angles to the principal plane thereof. The land formed on the board was made of copper. Both the front surface land portion and the back surface land portion were made in annular shape having an opening of the through hole at a center thereof. Each of the back surface land portions has an outer diameter (i.e. an outer diameter of its annular shape) of about 2.0 mm, and the back surface of the each board was covered with solder resist except for the back surface land portion so that the back surface land portion is exposed as a whole. The outer diameter of the back surface land portion was about 1.54 times as large as the diameter of the through hole. The front surface land portions have diameters of about 1.5 mm, 1.7 mm and 2.0 mm respectively, and the front surface of the each board was covered with the solder resist except for the front surface land portion so that the front surface land portion is exposed as a whole. The outer diameters of these front surface land portions were about 1.15 times, 1.31 times and 1.54 times, respectively, as large as the diameter of the through hole. A diode was used as the electronic component connected onto the board. The lead extending from the diode was a rod having a circular cross section of a diameter about 0.8 mm, comprising a base member of Cu and a plating member of Sn—Pb (including 5 to 15% of Pb and the balance of Sn)

applied on the base member. The lead extending from the diode was inserted into the though hole of the board, and the lead of the diode and the land of the board were connected with the solder material by flow soldering, thereby making the electronic circuit board. Sn-3Ag-0.5Cu (i.e. an alloy including about 3% by weight of Ag, about 0.5% by weight of Cu and Sn for the rest) or Sn-0.7Cu (i.e. an alloy including about 0.7% by weight of Cu and Sn for the rest) were used as the solder material in the flow soldering process. The flow soldering was carried out on three kinds of board having different outer diameters of the upper fillet portion as to each of these two solder materials. The outer diameter of the upper fillet portion of each of the electronic circuit board thus obtained was substantially equal to the outer diameter of the front surface land portion thereof.

Occurrence of lift-off was studied for the electronic circuit boards obtained as described above. The results are shown in Table 1.

TABLE 1

Occurrence of lift-off in the electronic circuit board of Example 1 (%)

| Solder material | Outer diameter of upper fillet portion (Ratio to through hole diameter) | | |
| --- | --- | --- | --- |
| | 1.5 mm (1.15 times) | 1.7 mm (1.31 times) | 2.0 mm (1.54 times) |
| Sn—3Ag—0.5Cu | 0% | 6% | 31% |
| Sn—0.7cu | 0% | 14% | 28% |

Referring Table 1, it can be seen that the occurrence of lift-off can be reduced more effectively in the case of the outer diameter of the upper fillet portion (which was equal to the outer diameter of the front surface land portion in this example) was 1.31 times, or further 1.15 times, as large as the diameter of the through hole than that in the case of 1.54 times as large as the diameter of the through hole. This indicates that the occurrence of lift-off can be reduced by decreasing the outer diameter of the upper fillet portion.

EXAMPLE 2

Connection structures as described in Embodiment 2 were made while varying the solder material used in flow soldering and the outer diameter of the upper fillet portion, and the occurrence of lift-off in the connection structures was studied. In this embodiment, electronic circuit boards were made similarly to Example 1 except that the outer diameter of each of the front surface land portions was about 2.0 mm, and that the peripheral edges of the front surface land portions were covered with the solder resist so as to make the outer diameters of the front surface land portions exposed from the solder resist about 1.5 mm, 1.7 mm and 2.0 mm, respectively. The outer diameters of the exposed front surface land portions were about 1.15 times, 1.31 times and 1.54 times, respectively, as large as the diameter of the through hole. The outer diameter of the upper fillet portion of each of the electronic circuit board thus obtained was substantially equal to the outer diameter of the exposed front surface land portion thereof.

Occurrence of lift-off was studied for the electronic circuit boards obtained as described above. The results are shown in Table 2.

TABLE 2

Occurrence of lift-off in the electronic circuit board of Example 2 (%)

| Solder material | Outer diameter of upper fillet portion (Ratio to through hole diameter) | | |
| --- | --- | --- | --- |
| | 1.5 mm (1.15 times) | 1.7 mm (1.31 times) | 2.0 mm (1.54 times) |
| Sn—3Ag—0.5Cu | 19% | 28% | 31% |
| Sn—0.7Cu | 19% | 14% | 28 |

Referring Table 2, it can be seen that the occurrence of lift-off can be reduced more effectively in the case of the outer diameter of the upper fillet portion (which was equal to the outer diameter of the exposed portion of the front surface land portion which does not covered by the solder resist in this example) was 1.31 times or 1.15 times as large as the diameter of the through hole than that in the case of 1.54 times as large as the diameter of the through hole. This indicates that the occurrence of lift-off can be reduced by decreasing the outer diameter of the upper fillet portion, similarly to Example 1.

Industrial Applicability

The present invention provides a connection structure comprising a board with electronic components connected thereon by flow soldering wherein the occurrence of lift-off is effectively reduced, and an electronic circuit board that includes such connection structure. This makes it possible to make the possibility of the occurrence of lift-off, that conspicuously occurs when the lead-free solder material is used, effectively lower than in the conventional construction.

What is claimed is:

1. A connection structure comprising:
   a board having a front surface and a back surface with a through hole formed to penetrate through the board;
   a land including a wall surface land portion formed on a wall surface of the through hole, a front surface land portion formed on the front surface of the board around the through hole and a back surface land portion formed on the back surface of the board around the through hole;
   a lead extending from an electronic component and disposed so as to penetrate the through hole from the front surface to the back surface of the board; and
   a fillet made of a solder material by flow soldering so as to connect the land and the lead, the fillet including an upper fillet portion located on the front surface of the board and a lower fillet portion located on the back surface of the board,
      wherein a profile of the upper fillet portion contacting with the front surface land portion is smaller than a profile of the lower fillet portion contacting with the back surface land portion, and is not smaller than a profile of the through hole.

2. The connection structure according to claim 1, wherein a profile of the front surface land portion is smaller than a profile of the back surface land portion.

3. The connection structure according to claim 1, wherein a peripheral edge of the front surface land portion is covered with a solder resist.

4. The connection structure according to claim 1, wherein the solder material is selected from the group consisting of Sn—Cu, Sn—Ag—Cu, Sn—Ag and Sn—Ag—Bi—Cu.

5. The connection structure according to claim 1, wherein all of metal elements that constitute the solder material and all of alloys made of two or more of the metal elements have melting points not lower than a melting point of the solder material.

6. The connection structure according to claim 1, wherein the lead comprises a base member and a plating member that covers the base member, and all of metal elements that constitute the solder material and the plating member and all of alloys made of two or more of the metal elements have melting points not lower than a melting point of the solder material.

7. The connection structure according to claim 1, wherein the lead includes a base member and a plating member that covers the base member, and at least one of: all of metal elements that constitute the base member; and all of alloys made of one or more of the metal elements that constitute the base member and one or more of metal elements that constitute the solder material and the plating member has melting points not lower than a melting point of said solder material, and the lead is provided with means for preventing the metal elements included in the base member from melting into the fillet.

8. An electronic circuit board comprising the connection structure according to claim 1.

9. The connection structure according to claim 6, wherein the plating member is made of a metal selected from the group consisting of Sn, Sn—Cu and Sn—Ag.

10. The connection structure according to claim 6, wherein all of metal elements that constitute the solder material, the base member and the plating member, and all of alloys made of two or more of the metal elements have melting points not lower than the melting point of the solder material.

11. The connection structure according to claim 6, wherein the base member is made of a material selected from the group consisting of Cu, Fe and an Fe—Cu alloy.

12. The connection structure according to claim 7, wherein the base member is made of a Zn based alloy and said means is an underlaying plating member made of Ni disposed between the base member and the plating member.

13. An electronic circuit board comprising the connection structure according to claim 2.

14. An electronic circuit board comprising the connection structure according to claim 3.

15. An electronic circuit board comprising the connection structure according to claim 4.

16. An electronic circuit board comprising the connection structure according to claim 5.

17. An electronic circuit board comprising the connection structure according to claim 6.

18. An electronic circuit board comprising the connection structure according to claim 7.

19. An electronic circuit board comprising the connection structure according to claim 9.

20. An electronic circuit board comprising the connection structure according to claim 8.

21. An electronic circuit board comprising the connection structure according to claim 12.

22. An electronic circuit board comprising the connection structure according to claim 11.

* * * * *

UNITED STATES PATENT AND TRADEMARK OFFICE
CERTIFICATE OF CORRECTION

PATENT NO. : 6,657,135 B2
DATED : December 2, 2003
INVENTOR(S) : Kenichiro Suetsugu et al.

It is certified that error appears in the above-identified patent and that said Letters Patent is hereby corrected as shown below:

Column 30,
Line 23, please replace "claim 8" with -- claim 10 --.

Signed and Sealed this

Thirtieth Day of November, 2004

JON W. DUDAS
*Director of the United States Patent and Trademark Office*